(12) United States Patent
Yamazaki

(10) Patent No.: US 8,598,635 B2
(45) Date of Patent: Dec. 3, 2013

(54) TRANSISTOR

(75) Inventor: Shunpei Yamazaki, Tokyo (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 361 days.

(21) Appl. No.: 12/912,374

(22) Filed: Oct. 26, 2010

(65) Prior Publication Data

US 2011/0101356 A1    May 5, 2011

(30) Foreign Application Priority Data

Oct. 30, 2009    (JP) .................................. 2009-251065

(51) Int. Cl.
*H01L 29/76* (2006.01)

(52) U.S. Cl.
USPC ............ 257/213; 257/E51.005; 257/E29.151; 438/149

(58) Field of Classification Search
USPC ........... 257/213, E51.005, E29.151; 438/149, 438/FOR. 201, FOR. 184
See application file for complete search history.

(56) References Cited

U.S. PATENT DOCUMENTS

| | | | |
|---|---|---|---|
| 5,731,856 A | 3/1998 | Kim et al. | |
| 5,744,864 A | 4/1998 | Cillessen et al. | |
| 6,115,172 A * | 9/2000 | Jeong ............................ 359/292 |
| 6,294,274 B1 | 9/2001 | Kawazoe et al. | |
| 6,563,174 B2 | 5/2003 | Kawasaki et al. | |
| 6,727,522 B1 | 4/2004 | Kawasaki et al. | |
| 7,049,190 B2 | 5/2006 | Takeda et al. | |
| 7,061,014 B2 | 6/2006 | Hosono et al. | |
| 7,064,346 B2 | 6/2006 | Kawasaki et al. | |
| 7,105,868 B2 | 9/2006 | Nause et al. | |
| 7,211,825 B2 | 5/2007 | Shih et al | |
| 7,282,782 B2 | 10/2007 | Hoffman et al. | |
| 7,297,977 B2 | 11/2007 | Hoffman et al. | |
| 7,323,356 B2 | 1/2008 | Hosono et al. | |
| 7,385,224 B2 | 6/2008 | Ishii et al. | |

(Continued)

FOREIGN PATENT DOCUMENTS

| EP | 1 737 044 A1 | 12/2006 |
|---|---|---|
| EP | 2 226 847 A2 | 9/2010 |

(Continued)

OTHER PUBLICATIONS

International Search Report, PCT Application No. PCT/JP2010/068229, dated Nov. 9, 2010, 3 pages.

(Continued)

*Primary Examiner* — Michelle Mandala
(74) *Attorney, Agent, or Firm* — Fish & Richardson P.C.

(57) ABSTRACT

It is an object to provide a thin film transistor with high speed operation, in which a large amount of current can flow when the thin film transistor is on and off-state current is extremely reduced when the thin film transistor is off. The thin film transistor is a vertical thin film transistor in which a channel formation region is formed using an oxide semiconductor film in which hydrogen is contained in an oxide semiconductor at a concentration of lower than or equal to $5 \times 10^{19}/cm^3$, preferably lower than or equal to $5 \times 10^{18}/cm^3$, more preferably lower than or equal to $5 \times 10^{17}/cm^3$, hydrogen or an OH group contained in the oxide semiconductor is/are removed, and carrier concentration is lower than or equal to $5 \times 10^{14}/cm^3$, preferably lower than or equal to $5 \times 10^{12}/cm^3$.

16 Claims, 15 Drawing Sheets

(56) References Cited

U.S. PATENT DOCUMENTS

| | | |
|---|---|---|
| 7,402,506 B2 | 7/2008 | Levy et al. |
| 7,411,209 B2 | 8/2008 | Endo et al. |
| 7,453,065 B2 | 11/2008 | Saito et al. |
| 7,453,087 B2 | 11/2008 | Iwasaki |
| 7,462,862 B2 | 12/2008 | Hoffman et al. |
| 7,468,304 B2 | 12/2008 | Kaji et al. |
| 7,501,293 B2 | 3/2009 | Ito et al. |
| 7,528,017 B2 | 5/2009 | Subramanian et al. |
| 7,601,984 B2 | 10/2009 | Sano et al. |
| 7,674,650 B2 | 3/2010 | Akimoto et al. |
| 7,732,819 B2 | 6/2010 | Akimoto et al. |
| 7,786,482 B2 | 8/2010 | Yamazaki et al. |
| 7,791,072 B2 | 9/2010 | Kumomi et al. |
| 7,791,074 B2 | 9/2010 | Iwasaki |
| 2001/0046027 A1 | 11/2001 | Tai et al. |
| 2002/0056838 A1 | 5/2002 | Ogawa |
| 2002/0132454 A1 | 9/2002 | Ohtsu et al. |
| 2003/0189401 A1 | 10/2003 | Kido et al. |
| 2003/0218222 A1 | 11/2003 | Wager, III et al. |
| 2004/0038446 A1 | 2/2004 | Takeda et al. |
| 2004/0127038 A1 | 7/2004 | Carcia et al. |
| 2005/0017302 A1 | 1/2005 | Hoffman |
| 2005/0199959 A1 | 9/2005 | Chiang et al. |
| 2006/0035452 A1 | 2/2006 | Carcia et al. |
| 2006/0043377 A1 | 3/2006 | Hoffman et al. |
| 2006/0086933 A1 | 4/2006 | Iechi et al. |
| 2006/0091793 A1 | 5/2006 | Baude et al. |
| 2006/0108529 A1 | 5/2006 | Saito et al. |
| 2006/0108636 A1 | 5/2006 | Sano et al. |
| 2006/0110867 A1 | 5/2006 | Yabuta et al. |
| 2006/0113536 A1 | 6/2006 | Kumomi et al. |
| 2006/0113539 A1 | 6/2006 | Sano et al. |
| 2006/0113549 A1 | 6/2006 | Den et al. |
| 2006/0113565 A1 | 6/2006 | Abe et al. |
| 2006/0169973 A1 | 8/2006 | Isa et al. |
| 2006/0170111 A1 | 8/2006 | Isa et al. |
| 2006/0197092 A1 | 9/2006 | Hoffman et al. |
| 2006/0208977 A1 | 9/2006 | Kimura |
| 2006/0214571 A1 | 9/2006 | Yamamoto et al. |
| 2006/0228974 A1 | 10/2006 | Thelss et al. |
| 2006/0231882 A1 | 10/2006 | Kim et al. |
| 2006/0238135 A1 | 10/2006 | Kimura |
| 2006/0244107 A1 | 11/2006 | Sugihara et al. |
| 2006/0284171 A1 | 12/2006 | Levy et al. |
| 2006/0284172 A1 | 12/2006 | Ishii |
| 2006/0292777 A1 | 12/2006 | Dunbar |
| 2007/0024187 A1 | 2/2007 | Shin et al. |
| 2007/0046191 A1 | 3/2007 | Saito |
| 2007/0052025 A1 | 3/2007 | Yabuta |
| 2007/0054507 A1 | 3/2007 | Kaji et al. |
| 2007/0090365 A1 | 4/2007 | Hayashi et al. |
| 2007/0108446 A1 | 5/2007 | Akimoto |
| 2007/0128760 A1 | 6/2007 | Subramanian et al. |
| 2007/0152217 A1 | 7/2007 | Lai et al. |
| 2007/0172591 A1 | 7/2007 | Seo et al. |
| 2007/0187678 A1 | 8/2007 | Hirao et al. |
| 2007/0187760 A1 | 8/2007 | Furuta et al. |
| 2007/0194379 A1 | 8/2007 | Hosono et al. |
| 2007/0252928 A1 | 11/2007 | Ito et al. |
| 2007/0272922 A1 | 11/2007 | Kim et al. |
| 2007/0287296 A1 | 12/2007 | Chang |
| 2008/0006877 A1 | 1/2008 | Mardilovich et al. |
| 2008/0038882 A1 | 2/2008 | Takechi et al. |
| 2008/0038929 A1 | 2/2008 | Chang |
| 2008/0050595 A1 | 2/2008 | Nakagawara et al. |
| 2008/0073653 A1 | 3/2008 | Iwasaki |
| 2008/0083950 A1 | 4/2008 | Pan et al. |
| 2008/0106191 A1 | 5/2008 | Kawase |
| 2008/0128689 A1 | 6/2008 | Lee et al. |
| 2008/0129195 A1 | 6/2008 | Ishizaki et al. |
| 2008/0166834 A1 | 7/2008 | Kim et al. |
| 2008/0182358 A1 | 7/2008 | Cowdery-Corvan et al. |
| 2008/0224133 A1 | 9/2008 | Park et al. |
| 2008/0254569 A1 | 10/2008 | Hoffman et al. |
| 2008/0258139 A1 | 10/2008 | Ito et al. |
| 2008/0258140 A1 | 10/2008 | Lee et al. |
| 2008/0258141 A1 | 10/2008 | Park et al. |
| 2008/0258143 A1 | 10/2008 | Kim et al. |
| 2008/0296568 A1 | 12/2008 | Ryu et al. |
| 2009/0045397 A1 | 2/2009 | Iwasaki |
| 2009/0068773 A1 | 3/2009 | Lai et al. |
| 2009/0073325 A1 | 3/2009 | Kuwabara et al. |
| 2009/0114910 A1 | 5/2009 | Chang |
| 2009/0134399 A1 | 5/2009 | Sakakura et al. |
| 2009/0152506 A1 | 6/2009 | Umeda et al. |
| 2009/0152541 A1 | 6/2009 | Maekawa et al. |
| 2009/0159885 A1 | 6/2009 | Yamazaki et al. |
| 2009/0179199 A1 | 7/2009 | Sano et al. |
| 2009/0195289 A1 | 8/2009 | Subramanian et al. |
| 2009/0278122 A1 | 11/2009 | Hosono et al. |
| 2009/0280600 A1 | 11/2009 | Hosono et al. |
| 2010/0065844 A1 | 3/2010 | Tokunaga |
| 2010/0084648 A1 | 4/2010 | Watanabe |
| 2010/0092800 A1 | 4/2010 | Itagaki et al. |
| 2010/0102313 A1 | 4/2010 | Miyairi et al. |
| 2010/0102314 A1 | 4/2010 | Miyairi et al. |
| 2010/0109002 A1 | 5/2010 | Itagaki et al. |
| 2010/0276689 A1 | 11/2010 | Iwasaki |
| 2010/0279462 A1 | 11/2010 | Iwasaki |
| 2011/0101336 A1 | 5/2011 | Yamazaki |
| 2011/0101337 A1 | 5/2011 | Yamazaki |
| 2011/0101338 A1 | 5/2011 | Yamazaki et al. |
| 2011/0101355 A1 | 5/2011 | Yamazaki |

FOREIGN PATENT DOCUMENTS

| | | |
|---|---|---|
| JP | 60-182762 A | 9/1985 |
| JP | 60-198861 A | 10/1985 |
| JP | 63-210022 A | 8/1988 |
| JP | 63-210023 A | 8/1988 |
| JP | 63-210024 A | 8/1988 |
| JP | 63-215519 A | 9/1988 |
| JP | 63-239117 A | 10/1988 |
| JP | 63-265818 A | 11/1988 |
| JP | 63-296378 A | 12/1988 |
| JP | 01-283879 A | 11/1989 |
| JP | 05-251705 A | 9/1993 |
| JP | 08-264794 A | 10/1996 |
| JP | 11-505377 A | 5/1999 |
| JP | 2000-044236 A | 2/2000 |
| JP | 2000-133819 A | 5/2000 |
| JP | 2000-150900 A | 5/2000 |
| JP | 2001-244482 A | 9/2001 |
| JP | 2002-076356 A | 3/2002 |
| JP | 2002-289859 A | 10/2002 |
| JP | 2003-086000 A | 3/2003 |
| JP | 2003-086808 A | 3/2003 |
| JP | 2003-110110 A | 4/2003 |
| JP | 2004-103957 A | 4/2004 |
| JP | 2004-273614 A | 9/2004 |
| JP | 2004-273732 A | 9/2004 |
| JP | 2005-167164 A | 6/2005 |
| JP | 2005-294571 A | 10/2005 |
| JP | 2006-165527 A | 6/2006 |
| JP | 2006-165528 A | 6/2006 |
| JP | 2006-165529 A | 6/2006 |
| JP | 2009-099847 A | 5/2009 |
| WO | 2004/114391 A1 | 12/2004 |
| WO | 2006/051993 A2 | 5/2006 |
| WO | 2007/029844 A1 | 3/2007 |
| WO | 2008/126879 A1 | 10/2008 |

OTHER PUBLICATIONS

Written Opinion, PCT Application No. PCT/JP2010/068229, dated Nov. 9, 2010, 3 pages.

Asakuma, N et al., "Crystallization and Reduction of Sol-Gel-Derived Zinc Oxide Films by Irradiation With Ultraviolet Lamp," Journal of Sol-Gel Science and Technology, 2003, vol. 26, pp. 181-184.

Asaoka, Y et al., "29.1: Polarizer-Free Reflective LCD Combined With Ultra Low-Power Driving Technology," SID Digest '09 : SID International Symposium Digest of Technical Papers, 2009, pp. 395-398.

(56) References Cited

OTHER PUBLICATIONS

Chern, H et al., "An Analytical Model for the Above-Threshold Characteristics of Polysilicon Thin-Film Transistors," IEEE Transactions on Electron Devices, Jul. 1, 1995, vol. 42, No. 7, pp. 1240-1246.

Cho, D et al., "21.2: Al and Sn-Doped Zinc Indium Oxide Thin Film Transistors for AMOLED Back-Plane," SID Digest '09 : SID International Symposium Digest of Technical Papers, May 31, 2009, pp. 280-283.

Clark, S et al., "First Principles Methods Using CASTEP," Zeitschrift fur Kristallographie, 2005, vol. 220, pp. 567-570.

Coates. D et al., Optical Studies of the Amorphous Liquid-Cholesteric Liquid Crystal Transition: The "Blue Phase," Physics Letters, Sep. 10, 1973, vol. 45A, No. 2, pp. 115-116.

Costello, M et al., "Electron Microscopy of a Cholesteric Liquid Crystal and Its Blue Phase," Phys. Rev. A (Physical Review. A), May 1, 1984, vol. 29, No. 5, pp. 2957-2959.

Dembo, H et al., "RFCPUS on Glass and Plastic Substrates Fabricated by TFT Transfer Technology," IEDM 05: Technical Digest of International Electron Devices Meeting, Dec. 5, 2005, pp. 1067-1069.

Fortunato, E et al., "Wide-Bandgap High-Mobility ZnO Thin-Film Transistors Produced at Room Temperature," Appl. Phys. Lett. (Applied Physics Letters), Sep. 27, 2004, vol. 85, No. 13, pp. 2541-2543.

Fung, T et al., "2-D Numerical Simulation of High Performance Amorphous In-Ga-Zn-O TFTs for Flat Panel Displays," AM-FPD '08 Digest of Technical Papers, Jul. 2, 2008, pp. 251-252, The Japan Society of Applied Physics.

Godo, H et al., "P-9: Numerical Analysis on Temperature Dependence of Characteristics of Amorphous In-Ga-Zn-Oxide TFT," SID Digest '09 : SID International Symposium Digest of Technical Papers, May 31, 2009, pp. 1110-1112.

Godo, H et al., "Temperature Dependence of Characteristics and Electronic Structure for Amorphous In-Ga-Zn-Oxide TFT," AM-FPD '09 Digest of Technical Papers, Jul. 1, 2009, pp. 41-44.

Hayashi, R et al., "42.1: Invited Paper: Improved Amorphous In-Ga-Zn-O TFTs," SID Digest '08 : SID International Symposium Digest of Technical Papers, May 20, 2008, vol. 39, pp. 621-624.

Hirao, T et al., "Novel Top-Gate Zinc Oxide Thin-Film Transistors (ZnO TFTs) for AMLCDS," Journal of the SID , 2007, vol. 15, No. 1, pp. 17-22.

Hosono, H et al., "Working hypothesis to explore novel wide band gap electrically conducting amorphous oxides and examples," J. Non-Cryst. Solids (Journal of Non-Crystalline Solids), 1996, vol. 198-200, pp. 165-169.

Hosono, H, "68.3: Invited Paper:Transparent Amorphous Oxide Semiconductors for High Performance TFT," SID Digest '07 : SID International Symposium Digest of Technical Papers, 2007, vol. 38, pp. 1830-1833.

Hsieh, H et al., "P-29: Modeling of Amorphous Oxide Semiconductor Thin Film Transistors and Subgap Density of States," SID Digest '08 : SID International Symposium Digest of Technical Papers, 2008, vol. 39, pp. 1277-1280.

Ikeda, T et al., "Full-Functional System Liquid Crystal Display Using CG-Silicon Technology," SID Digest '04 : SID International Symposium Digest of Technical Papers, 2004, vol. 35, pp. 860-863.

Janotti, A et al., "Native Point Defects in ZnO," Phys. Rev. B (Physical Review. B), 2007, vol. 76, No. 16, pp. 165202-1-165202-22.

Janotti, A et al., "Oxygen Vacancies in ZnO," Appl. Phys. Lett. (Applied Physics Letters), 2005, vol. 87, pp. 122102-1-122102-3.

Jeong, J et al., "3.1: Distinguished Paper: 12.1-Inch WXGA AMOLED Display Driven by Indium-Gallium-Zinc Oxide TFTs Array," SID Digest '08 : SID International Symposium Digest of Technical Papers, May 20, 2008, vol. 39, No. 1, pp. 1-4.

Jin, D et al., "65.2: Distinguished Paper:World-Largest (6.5") Flexible Full Color Top Emission AMOLED Display on Plastic Film and Its Bending Properties," SID Digest '09 : SID International Symposium Digest of Technical Papers, May 31, 2009, pp. 983-985.

Kanno, H et al., "White Stacked Electrophosphorecent Organic Light-Emitting Devices Employing MOO3 as a Charge-Generation Layer," Adv. Mater. (Advanced Materials), 2006, vol. 18, No. 3, pp. 339-342.

Kikuchi, H et al., "39.1: Invited Paper: Optically Isotropic Nano-Structured Liquid Crystal Composites for Display Applications," SID Digest '09 : SID International Symposium Digest of Technical Papers, May 31, 2009, pp. 578-581.

Kikuchi, H et al., "62.2: Invited Paper: Fast Electro-Optical Switching in Polymer-Stabilized Liquid Crystalline Blue Phases for Display Application," SID Digest '07 : SID International Symposium Digest of Technical Papers, 2007, vol. 38, pp. 1737-1740.

Kikuchi, H et al., "Polymer-Stabilized Liquid Crystal Blue Phases," Nature Materials, Sep. 1, 2002, vol. 1, pp. 64-68.

Kim, S et al., "High-Performance oxide thin film transistors passivated by various gas plasmas," The Electrochemical Society, 214th ECS Meeting, 2008, No. 2317, 1 page.

Kimizuka, N et al., Spinel,YbFe2O4, and Yb2Fe3O7 Types of Structures for Compounds in the In2O3 and Sc2O3-A2O3-BO Systems [A; Fe, Ga, or Al; B: Mg, Mn, Fe, Ni, Cu,or Zn] at Temperatures Over 1000° C., Journal of Solid State Chemistry, 1985, vol. 60, pp. 382-384.

Kimizuka, N et al., "Syntheses and Single-Crystal Data of Homologous Compounds, In2O3(ZnO)m (m=3, 4, and 5), InGaO3(ZnO)3, and Ga2O3(ZnO)m (m=7, 8, 9, and 16) in the In2O3-ZnGa2O4-ZnO System," Journal of Solid State Chemistry, Apr. 1, 1995, vol. 116, No. 1, pp. 170-178.

Kitzerow, H et al., "Observation of Blue Phases in Chiral Networks," Liquid Crystals, 1993, vol. 14, No. 3, pp. 911-916.

Kurokawa, Y et al., "UHF RFCPUS on Flexible and Glass Substrates for Secure RFID Systems," Journal of Solid-State Circuits , 2008, vol. 43, No. 1, pp. 292-299.

Lany, S et al., "Dopability, Intrinsic Conductivity, and Nonstoichiometry of Transparent Conducting Oxides," Phys. Rev. Lett. (Physical Review Letters), Jan. 26, 2007, vol. 98, pp. 045501-1-045501-4.

Lee, H et al., "Current Status of, Challenges to, and Perspective View of AM-OLED," IDW '06 : Proceedings of the 13th International Display Workshops, Dec. 7, 2006, pp. 663-666.

Lee, J et al., "World's Largest (15-Inch) XGA AMLCD Panel Using IGZO Oxide TFT," SID Digest '08 : SID International Symposium Digest of Technical Papers, May 20, 2008, vol. 39, pp. 625-628.

Lee, M et al., "15.4: Excellent Performance of Indium-Oxide-Based Thin-Film Transistors by DC Sputtering," SID Digest '09 : SID International Symposium Digest of Technical Papers, May 31, 2009, pp. 191-193.

Li, C et al., "Modulated Structures of Homologous Compounds InMO3(ZnO)m (M=In,Ga; m=Integer) Described by Four-Dimensional Superspace Group," Journal of Solid State Chemistry, 1998, vol. 139, pp. 347-355.

Masuda, S et al., "Transparent thin film transistors using ZnO as an active channel layer and their electrical properties," J. Appl. Phys. (Journal of Applied Physics), Feb. 1, 2003, vol. 93, No. 3, pp. 1624-1630.

Meiboom, S et al., "Theory of the Blue Phase of Cholesteric Liquid Crystals," Phys. Rev. Lett. (Physical Review Letters), May 4, 1981, vol. 46, No. 18, pp. 1216-1219.

Miyasaka, M, "SUFTLA Flexible Microelectronics on Their Way to Business," SID Digest '07 : SID International Symposium Digest of Technical Papers, 2007, vol. 38, pp. 1673-1676.

Mo, Y et al., "Amorphous Oxide TFT Backplanes for Large Size AMOLED Displays," IDW '08 : Proceedings of the 6th International Display Workshops, Dec. 3, 2008, pp. 581-584.

Nakamura, "Synthesis of Homologous Compound with New Long-Period Structure," NIRIM Newsletter, Mar. 1995, vol. 150, pp. 1-4 with English translation.

Nakamura, M et al., "The phase relations in the In2O3-Ga2ZnO4-ZnO system at 1350° C.," Journal of Solid State Chemistry, Aug. 1, 1991, vol. 93, No. 2, pp. 298-315.

Nomura, K et al., "Thin-Film Transistor Fabricated in Single-Crystalline Transparent Oxide Semiconductor," Science, May 23, 2003, vol. 300, No. 5623, pp. 1269-1272.

(56) References Cited

OTHER PUBLICATIONS

Nomura, K et al., "Amorphous Oxide Semiconductors for High-Performance Flexible Thin-Film Transistors," Jpn. J. Appl. Phys. (Japanese Journal of Applied Physics), 2006, vol. 45, No. 5B, pp. 4303-4308.

Nomura, K et al., "Room-Temperature Fabrication of Transparent Flexible Thin-Film Transistors Using Amorphous Oxide Semiconductors," Nature, Nov. 25, 2004, vol. 432, pp. 488-492.

Nomura, K et al., "Carrier transport in transparent oxide semiconductor with intrinsic structural randomness probed using single-crystalline InGaO3(ZnO)5 films," Appl. Phys. Lett. (Applied Physics Letters), Sep. 13, 2004, vol. 85, No. 11, pp. 1993-1995.

Nowatari, H et al., "60.2: Intermediate Connector With Suppressed Voltage Loss for White Tandem OLEDS," SID Digest '09 : SID International Symposium Digest of Technical Papers, May 31, 2009, vol. 40, pp. 899-902.

Oba, F et al., "Defect energetics in ZnO: A hybrid Hartree-Fock density functional study," Phys. Rev. B (Physical Review. B), 2008, vol. 77, pp. 245202-1-245202-6.

Oh, M et al., "Improving the Gate Stability of ZnO Thin-Film Transistors With Aluminum Oxide Dielectric Layers," J. Electrochem. Soc. (Journal of the Electrochemical Society), 2008, vol. 155, No. 12, pp. H1009-H1014.

Ohara, H et al., "21.3: 4.0 In. QVGA AMOLED Display Using In-Ga-Zn-Oxide TFTs With a Novel Passivation Layer," SID Digest '09 : SID International Symposium Digest of Technical Papers, May 31, 2009, pp. 284-287.

Ohara, H et al., "Amorphous In-Ga-Zn-Oxide TFTs with Suppressed Variation for 4.0 inch QVGA AMOLED Display," AM-FPD '09 Digest of Technical Papers, Jul. 1, 2009, pp. 227-230, The Japan Society of Applied Physics.

Orita, M et al., "Amorphous transparent conductive oxide InGaO3(ZnO)m (m<4):a Zn4s conductor," Philosophical Magazine, 2001, vol. 81, No. 5, pp. 501-515.

Orita, M et al., "Mechanism of Electrical Conductivity of Transparent InGaZnO4," Phys. Rev. B (Physical Review. B), Jan. 15, 2000, vol. 61, No. 3, pp. 1811-1816.

Osada, T et al., "15.2: Development of Driver-Integrated Panel using Amorphous In-Ga-Zn-Oxide TFT," SID Digest '09 : SID International Symposium Digest of Technical Papers, May 31, 2009, pp. 184-187.

Osada, T et al., "Development of Driver-Integrated Panel Using Amorphous In-Ga-Zn-Oxide TFT," AM-FPD '09 Digest of Technical Papers, Jul. 1, 2009, pp. 33-36.

Park, J et al., "Dry etching of ZnO films and plasma-induced damage to optical properties," J. Vac. Sci. Technol. B (Journal of Vacuum Science & Technology B), Mar. 1, 2003, vol. 21, No. 2, pp. 800-803.

Park, J et al., "Improvements in the Device Characteristics of Amorphous Indium Gallium Zinc Oxide Thin-Film Transistors by Ar Plasma Treatment," Appl. Phys. Lett. (Applied Physics Letters), Jun. 26, 2007, vol. 90, No. 26, pp. 262106-1-262106-3.

Park, J et al., "Electronic Transport Properties of Amorphous Indium-Gallium-Zinc Oxide Semiconductor Upon Exposure to Water," Appl. Phys. Lett. (Applied Physics Letters), 2008, vol. 92, pp. 072104-1-072104-3.

Park, J et al., "High performance amorphous oxide thin film transistors with self-aligned top-gate structure," IEDM 09: Technical Digest of International Electron Devices Meeting, Dec. 7, 2009, pp. 191-194.

Park, Sang-Hee et al., "42.3: Transparent ZnO Thin Film Transistor for the Application of High Aperture Ratio Bottom Emission AM-OLED Display," SID Digest '08 : SID International Symposium Digest of Technical Papers, May 20, 2008, vol. 39, pp. 629-632.

Park, J et al., "Amorphous Indium-Gallium-Zinc Oxide TFTs and Their Application for Large Size AMOLED," AM-FPD '08 Digest of Technical Papers, Jul. 2, 2008, pp. 275-278.

Park, S et al., "Challenge to Future Displays: Transparent AM-OLED Driven by Peald Grown ZnO TFT," IMID '07 Digest, 2007, pp. 1249-1252.

Prins, M et al., "A Ferroelectric Transparent Thin-Film Transistor," Appl. Phys. Lett. (Applied Physics Letters), Jun. 17, 1996, vol. 68, No. 25, pp. 3650-3652.

Sakata, J et al., "Development of 4.0-In. AMOLED Display With Driver Circuit Using Amorphous In-Ga-Zn-Oxide TFTs," IDW '09 : Proceedings of the 16th International Display Workshops, 2009, pp. 689-692.

Son, K et al., "42.4L: Late-News Paper: 4 Inch QVGA AMOLED Driven by the Threshold Voltage Controlled Amorphous GIZO (Ga2O3-In2O3-ZnO) TFT," SID Digest '08 : SID International Symposium Digest of Technical Papers, May 20, 2008, vol. 39, pp. 633-636.

Takahashi, M et al., "Theoretical Analysis of IGZO Transparent Amorphous Oxide Semiconductor," IDW '08 : Proceedings of the 15th International Display Workshops, Dec. 3, 2008, pp. 1637-1640.

Tsuda, K et al., "Ultra Low Power Consumption Technologies for Mobile TFT-LCDs," IDW '02 : Proceedings of the 9th International Display Workshops, Dec. 4, 2002, pp. 295-298.

Ueno, K et al., "Field-Effect Transitor on SrTiO3 With Sputtered Al2O3 Gate Insulator," Appl. Phys. Lett. (Applied Physics Letters), Sep. 1, 2003, vol. 83, No. 9, pp. 1755-1757.

Van De Walle, C, "Hydrogen as a Cause of Doping in Zinc Oxide," Phys. Rev. Lett. (Physical Review Letters), Jul. 31, 2000, vol. 85, No. 5, pp. 1012-1015.

* cited by examiner

TRANSISTOR

TECHNICAL FIELD

The present invention relates to a field-effect transistor, for example a thin film transistor formed using an oxide semiconductor.

BACKGROUND ART

A lot of attention has been paid to the technology of forming a field-effect transistor, for example a thin film transistor (TFT), by using a semiconductor thin film that is formed over a substrate having an insulating surface. The thin film transistor is used for a display device typified by a liquid crystal television. Although silicon-based semiconductor material is known as a material for a semiconductor thin film which can be applied to the thin film transistor, an oxide semiconductor has attracted attention as another material.

As the material for the oxide semiconductor, zinc oxide and a material containing zinc oxide are known. A thin film transistor formed using an amorphous oxide (oxide semiconductor) whose electronic carrier concentration is lower than $10^{18}/cm^3$ is disclosed (Patent Documents 1 to 3).

REFERENCE

[Patent Document 1] Japanese Published Patent Application No. 2006-165527
[Patent Document 2] Japanese Published Patent Application No. 2006-165528
[Patent Document 3] Japanese Published Patent Application No. 2006-165529

DISCLOSURE OF INVENTION

Deviation from the stoichiometric composition of an oxide semiconductor arises in a thin film formation process. For example, electrical conductivity of an oxide semiconductor is changed because of excess and deficiency of oxygen. Further, hydrogen which is mixed in an oxide semiconductor during thin film formation is used to form oxygen (O)-hydrogen (H) bonds to serve as an electron donor, which is a factor for changing the electric conductivity. Since an OH group is polarized, an OH bond is a factor for changing characteristics of an active device such as a thin film transistor formed using an oxide semiconductor.

Even when the electronic carrier concentration is lower than $10^{18}/cm^3$, an oxide semiconductor is a substantially n-type oxide semiconductor, and ON/OFF ratio of the thin film transistors disclosed in the above Patent Documents is just $10^3$. The reason the ON/OFF ratio of such a thin film transistor is low is that off-state current is high.

In the display device, there is a problem in that unwanted charge build-up is caused in elements, electrodes, or wirings during manufacture or operation. In the case of a thin film transistor, for example, such charge build-up will generate a parasitic channel which allows leakage current to flow. Further, in the case where a bottom gate transistor is used, charge may build up on a surface of or in a back channel portion in a semiconductor layer (i.e., a region of a semiconductor layer which is sandwiched between a source electrode and a drain electrode which are formed over the semiconductor layer) and generate a parasitic channel, so that leakage current is likely to occur and threshold voltage varies.

In order to increase field-effect mobility of a thin film transistor, the channel length along which carriers transfer is preferably small. However, when the channel length is small, off-state current of the thin film transistor is increased.

Thus, it is an object of one embodiment of the present invention to provide a thin film transistor with high speed operation, in which a large mount of current can flow when the thin film transistor is on and off-state current is extremely reduced when the thin film transistor is off.

One embodiment of the present invention is a vertical thin film transistor in which a channel formation region is formed using an oxide semiconductor which has a larger energy gap than a silicon semiconductor and which is an intrinsic or substantially intrinsic semiconductor by removal of impurities which can be an electron donor (donor) in the oxide semiconductor.

That is, one embodiment of the present invention is a vertical thin film transistor in which a channel formation region is formed using an oxide semiconductor film in which hydrogen is contained in an oxide semiconductor at a concentration of lower than or equal to $5\times10^{19}/cm^3$, preferably lower than or equal to $5\times10^{18}/cm^3$, more preferably lower than or equal to $5\times10^{17}/cm^3$, and hydrogen or an OH group contained in the oxide semiconductor is/are removed, and carrier concentration is lower than or equal to $5\times10^{14}/cm^3$, preferably lower than or equal to $5\times10^{12}/cm^3$.

The energy gap of the oxide semiconductor is greater than or equal to 2 eV, preferably greater than or equal to 2.5 eV, more preferably greater than or equal to 3 eV. The impurities such as hydrogen which forms a donor are reduced as much as possible. The carrier concentration is lower than or equal to $1\times10^{14}/cm^3$, preferably lower than or equal to $1\times10^{12}/cm^3$.

Note that in one embodiment of the present invention, a gate electrode of the thin film transistor has a ring shape and surrounds a source electrode, an oxide semiconductor film, and a drain electrode with a gate insulating film interposed therebetween. That is, the gate electrode faces side surfaces of the source electrode, the oxide semiconductor film, and the drain electrode with the gate insulating film interposed therebetween. Therefore, the channel width is large.

According to one embodiment of the present invention, an oxide semiconductor whose hydrogen concentration is reduced and purity is increased is used, so that field-effect mobility and an on-state current of the field-effect transistor, for example the thin film transistor can be improved, and very low off-state current can be obtained.

BRIEF DESCRIPTION OF DRAWINGS

FIGS. 11A-1 and 11A-2 are plan views of semiconductor devices.

BEST MODE FOR CARRYING OUT THE INVENTION

Figure 1A:
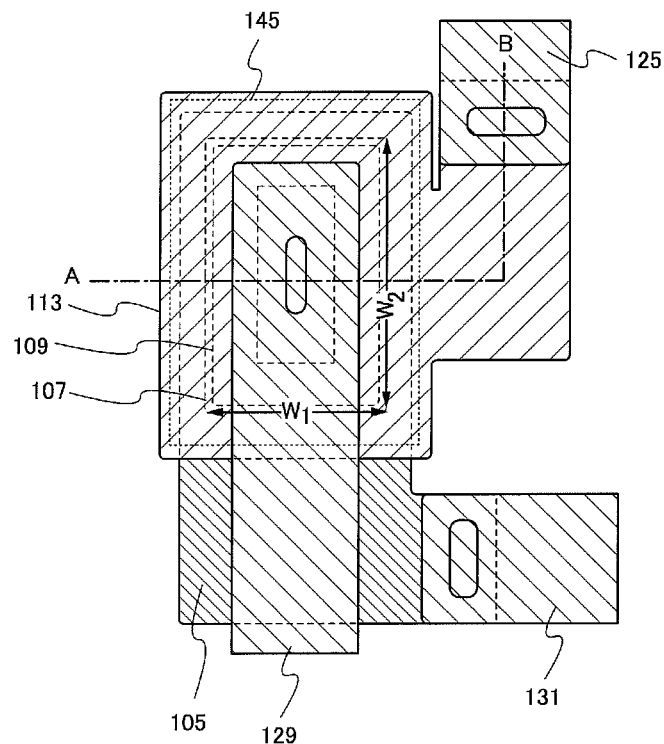
FIGS. 1A and 1B are a top view and a cross-sectional view illustrating a thin film transistor.

Embodiments of the present invention will be described below with reference to the accompanying drawings. Note that the present invention is not limited to the following description, and it will be easily understood by those skilled in the art that various changes and modifications can be made without departing from the spirit and scope of the present invention. Therefore, the present invention should not be construed as being limited to the description in the following embodiments. Note that in structures of the present invention described hereinafter, like portions or portions having similar functions are denoted by the same reference numerals in different drawings, and description thereof is not repeated.

Note that in each drawing described in this specification, a size of each component or a thickness of each layer or an area is exaggerated in some cases for clarification. Therefore, embodiments of the present invention are not limited to such scales.

Note that the numeral terms such as "first", "second", and "third" in this specification are used in order to avoid confusion between components and do not set a limitation on number. Therefore, for example, description can be made even when "first" is replaced with "second" or "third", as appropriate.

Note that "voltage" indicates a difference between potential of two points, and "potential" indicates electrostatic energy (electrical potential energy) of a unit charge at a given point in an electrostatic field. Note that in general, an electric potential of difference between a potential of one point and a reference potential (e.g. a ground potential) is merely called a potential or voltage, and a potential and voltage are used as synonymous words in many cases. Thus, in this specification, a potential may be rephrased as voltage and voltage may be rephrased as a potential unless otherwise specified.

(Embodiment 1)

In this embodiment, a structure of a field-effect transistor, for example a thin film transistor will be described with reference to FIGS. 1A and 1B.

Figure 1B:
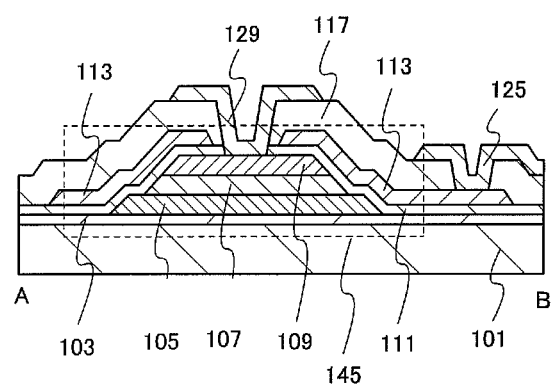

FIG. 1A is a top view of a thin film transistor 145, and FIG. 1B corresponds to a cross-sectional view of dashed line A-B of FIG. 1A.

As illustrated in FIG. 1B, a first electrode 105, an oxide semiconductor film 107, and a second electrode 109 are stacked over an insulating film 103 formed over a substrate 101. A gate insulating film 111 is provided so as to cover the first electrode 105, the oxide semiconductor film 107, and the second electrode 109. A third electrode 113 is provided over the gate insulating film 111. An insulating film 117 functioning as an interlayer insulating film is provided over the gate insulating film 111 and the third electrode 113. Openings are formed in the insulating film 117, and a wiring 131 (see FIG. 1A) connected via the opening to the first electrode 105, a wiring 129 connected via the opening to the second electrode 109, and a wiring 125 connected via the opening to the third electrode 113 are formed.

The first electrode 105 functions as one of a source electrode and a drain electrode of the thin film transistor 145. The second electrode 109 functions as the other of the source electrode and the drain electrode of the thin film transistor 145. The third electrode 113 functions as a gate electrode of the thin film transistor 145.

In this embodiment, the third electrode 113 functioning as the gate electrode has a ring shape. When the third electrode 113 functioning as the gate electrode has a ring shape, the channel width of the thin film transistor can be increased. Accordingly, on-state current of the thin film transistor can be increased.

Note that a thin film transistor is an element that includes at least three terminals, including a gate, a drain, and a source. The thin film transistor includes a channel formation region between a drain region and a source region, and current can flow through the drain region, the channel formation region, and the source region. Here, since the source and the drain of the thin film transistor may change depending on a structure, operating conditions, and the like of the thin film transistor, it is difficult to define which is a source or a drain. Therefore, a region functioning as a source and a drain is not called the source or the drain in some cases. In such a case, for example, one of the source and the drain may be referred to as a first terminal and the other thereof may be referred to as a second terminal. Alternatively, one of the source and the drain may be referred to as a first electrode and the other thereof may be referred to as a second electrode. Further alternatively, one of the source and the drain may be referred to as a first region and the other thereof may be referred to as a second region.

It is necessary that the substrate 101 at least have enough heat resistance to heat treatment to be performed later. As the substrate 101, a glass substrate of barium borosilicate glass, aluminoborosilicate glass, or the like can be used.

As the glass substrate, in the case where the temperature of the heat treatment to be performed later is high, the one whose strain point is higher than or equal to 730° C. is preferably used. As a glass substrate, a glass material such as aluminosilicate glass, aluminoborosilicate glass, or barium borosilicate glass is used, for example. Note that in general, by containing a larger amount of barium oxide (BaO) than boric acid, a glass substrate which is heat-resistant and more practical can be obtained. Therefore, a glass substrate containing BaO and $B_2O_3$ so that the amount of BaO is larger than that of $B_2O_3$ is preferably used.

Note that a substrate formed of an insulator, such as a ceramic substrate, a quartz substrate, or a sapphire substrate, may be used, instead of the glass substrate. Alternatively, a crystallized glass substrate or the like may be used.

The insulating film 103 is formed using an oxide insulating film such as a silicon oxide film or a silicon oxynitride film; or a nitride insulating film such as a silicon nitride film, a silicon nitride oxide film, an aluminum nitride film, or an aluminum nitride oxide film. In addition, the insulating film 103 may have a stacked structure, for example, a stacked structure in which one or more of the nitride insulating films and one or more of the oxide insulating film are stacked in that order over the substrate 101.

The first electrode 105 and the second electrode 109 are formed using an element selected from aluminum, chromium, copper, tantalum, titanium, molybdenum, tungsten, or yttrium; an alloy containing any of these elements as a component; an alloy containing these elements in combination; or the like. Alternatively, one or more materials selected from manganese, magnesium, zirconium, and beryllium can be used. In addition, the first electrode 105 can have a single-layer structure or a stacked structure having two or more layers. For example, a single-layer structure of an aluminum film containing silicon; a two-layer structure of an aluminum film and a titanium film stacked thereover; a two-layer structure of a tungsten film and a titanium film stacked thereover; a three-layer structure in which a titanium film, an aluminum film, and a titanium film are stacked in that order; and the like can be given. Alternatively, a film, an alloy film, or a nitride film which contains aluminum and one or more elements selected from titanium, tantalum, tungsten, molybdenum, chromium, neodymium, and scandium may be used.

Note that as the oxide semiconductor film 107, a thin film expressed by $InMO_3(ZnO)_m$ (m>0, where m is not necessarily an integer) can be used. Here, M represents one or more metal elements selected from Ga, Fe, Ni, Mn, and Co. For example, M may be Ga, Ga and Ni, Ga and Fe, or the like. The oxide semiconductor film may contain a transition metal element or oxide of the transition metal element as an impurity element in addition to the metal element contained as M. Among oxide semiconductor layers whose composition formulae are expressed by $InMO_3(ZnO)_m$ (m>0 and m is not an integer), an oxide semiconductor which contains Ga as M is referred to as an In—Ga—Zn—O-based oxide semiconductor, and a thin film of the In—Ga—Zn—O-based oxide semiconductor is referred to as an In—Ga—Zn—O-based film.

As the oxide semiconductor film 107, any of the following oxide semiconductor films can be applied as well as the above In—Ga—Zn—O-based film: an In—Sn—Zn—O-based oxide semiconductor film; an In—Al—Zn—O-based oxide semiconductor film; a Sn—Ga—Zn—O-based oxide semiconductor film; an Al—Ga—Zn—O-based oxide semiconductor film; an Sn—Al—Zn—O-based oxide semiconductor film; an In—Zn—O-based oxide semiconductor film; a Sn—Zn—O-based oxide semiconductor film; an Al—Zn—O-based oxide semiconductor film; an In—O-based oxide semiconductor film; a Sn—O-based oxide semiconductor film; and a Zn—O-based oxide semiconductor film. Further, the oxide semiconductor film may further contain Si.

Hydrogen contained in the oxide semiconductor is removed, so that the concentration of hydrogen in the oxide semiconductor film 107 used in this embodiment is lower than or equal to $5\times10^{19}/cm^3$, preferably lower than or equal to $5\times10^{18}/cm^3$, more preferably lower than or equal to $5\times10^{17}/cm^3$. That is, the oxide semiconductor film is highly purified so that impurities that are not main components of the oxide semiconductor film may be contained as little as possible. The carrier concentration of the oxide semiconductor film 107 is lower than or equal to $5\times10^{14}/cm^3$, preferably lower than or equal to $1\times10^{14}/cm^3$, more preferably lower than or equal to $5\times10^{12}/cm^3$, further preferably lower than or equal to $1\times10^{12}/cm^3$. That is, the carrier concentration of the oxide semiconductor film is as close to zero as possible. Furthermore, the energy gap is greater than or equal to 2 eV, preferably greater than or equal to 2.5 eV, more preferably greater than or equal to 3 eV. Note that the hydrogen concentration in the oxide semiconductor film can be detected by secondary ion mass spectroscopy (SIMS). The carrier concentration can be measured by the Hall effect measurement.

In this embodiment, since the shape of the top surface of the oxide semiconductor film of the transistor is rectangular, the channel width W is the sum of $2W_1$ and $2W_2$. Note that in the case where the shape of the top surface of the oxide semiconductor film of the transistor is circular, the channel width W is $2\pi r$ where r is a radius of the oxide semiconductor film.

The thickness of the oxide semiconductor film 107 may be greater than or equal to 30 nm and less than or equal to 3000 nm. When the thickness of the oxide semiconductor film 107 is small, the channel length L of the thin film transistor can be decreased; thus a thin film transistor having high on-state current and high field-effect mobility can be manufactured. On the other hand, when the thickness of the oxide semiconductor film 107 is large, typically greater than or equal to 100 nm and less than or equal to 3000 nm, a semiconductor device for high power can be manufactured.

The gate insulating film 111 can be a single-layer or a stack formed using a silicon oxide film, a silicon nitride film, a silicon oxynitride film, a silicon nitride oxide film, or an aluminum oxide film. A portion of the gate insulating film 111 which is in contact with the oxide semiconductor film 107 preferably contains oxygen, and in particular, the gate insulating film 111 is preferably formed using a silicon oxide film. A silicon oxide film is used, so that oxygen can be supplied to the oxide semiconductor film 107 and favorable characteristics can be obtained.

The gate insulating film 111 is formed using a high-k material such as hafnium silicate ($HfSiO_x$ (x>0)), $HfSiO_xN_y$ (x>0, y>0), hafnium aluminate ($HfAlO_x$ (x>0)), hafnium oxide, or yttrium oxide, so that gate leakage current can be reduced. Further, a stacked structure can be used in which a high-k material and one or more of a silicon oxide film, a silicon nitride film, a silicon oxynitride film, a silicon nitride oxide film, and an aluminum oxide film are stacked. The thickness of the gate insulating film 111 may be greater than or equal to 50 nm and less than or equal to 500 nm. When the thickness of the gate insulating film 111 is small, a thin film transistor having high field-effect mobility can be manufactured; thus a driver circuit can be manufactured on the same substrate as the thin film transistor. In contrast, when the thickness of the gate insulating film 111 is large, gate leakage current can be reduced.

The third electrode 113 functioning as a gate electrode is formed using an element selected from aluminum, chromium, copper, tantalum, titanium, molybdenum, or tungsten; an alloy containing any of these elements as a component; an alloy film containing these elements in combination; or the like. Alternatively, one or more materials selected from manganese, magnesium, zirconium, or beryllium may be used. In addition, the third electrode 113 can have a single-layer structure or a stacked structure having two or more layers. For example, a single-layer structure of an aluminum film containing silicon; a two-layer structure of an aluminum film and a titanium film stacked thereover; a three-layer structure in which a titanium film, an aluminum film, and a titanium film are stacked in that order; and the like can be given. Alternatively, a film, an alloy film, or a nitride film which contains aluminum and one or more elements selected from titanium, tantalum, tungsten, molybdenum, chromium, neodymium, or scandium may be used.

Next, operation of the thin film transistor having the oxide semiconductor film 107 will be described with reference to energy band diagrams.

Figure 2:
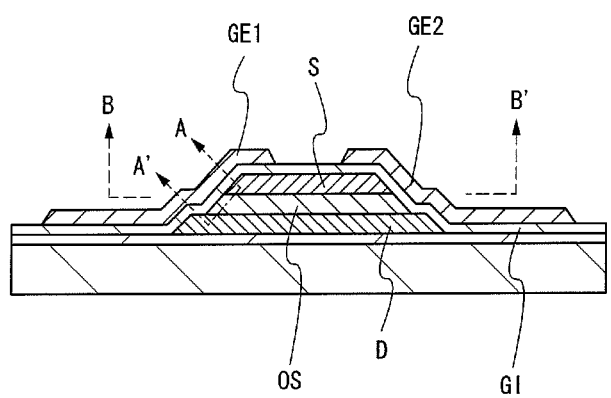
FIG. 2 is a longitudinal cross-sectional view of an inverted staggered thin film transistor formed using an oxide semiconductor.

FIG. 2 is a longitudinal cross-sectional view of an inverted staggered thin film transistor formed using the oxide semiconductor film described in this embodiment. An oxide semiconductor film (OS) and a source electrode (S) are stacked over a drain electrode (D). A gate insulating film (GI) is provided over the drain electrode, the oxide semiconductor film, and the source electrode, and a gate electrode (GE1) is provided thereover.

Figure 3A:
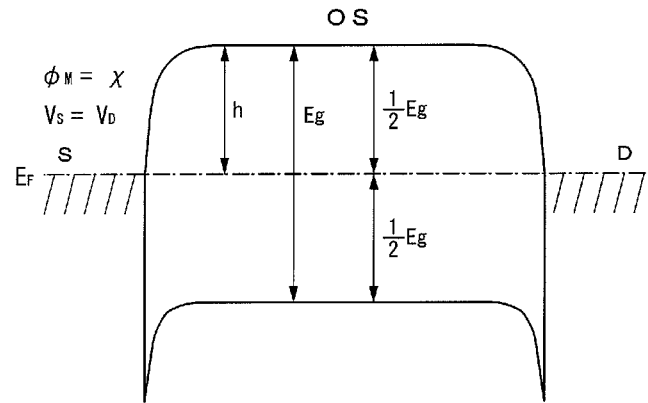
FIGS. 3A and 3B are energy band diagrams (schematic diagrams) of an A-A' cross section illustrated in FIG. 2.
Figure 3B:
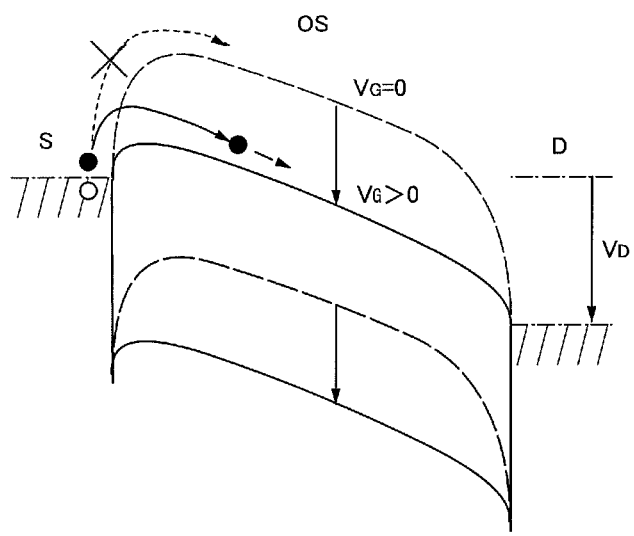

FIGS. 3A and 3B are energy band diagrams (schematic diagrams) of a cross-section taken along line A-A' in FIG. 2. FIG. 3A illustrates an energy band diagram (schematic diagram) in the case where voltage between the source and the drain is set to ($V_D=0V$), and FIG. 3B illustrates an energy band diagram (schematic diagram) of a cross-section taken along line A-A' in FIG. 2. Dashed lines show the case where voltage is not applied to the gate ($V_G=0$) under the condition such that positive voltage ($V_D>0$) is applied to the drain, and solid lines show the case where positive voltage ($V_G>0$) is applied to the gate under the condition such that positive voltage ($V_D>0$) is applied to the drain. In the case where voltage is not applied to the gate, a carrier (electron) is not injected from the electrode to the oxide semiconductor side because of the high potential barrier, so that current does not flow, which means an off state. On the other hand, when positive voltage is applied to the gate, a potential barrier is lowered, so that current flows, which means an on state.

Figure 4A:
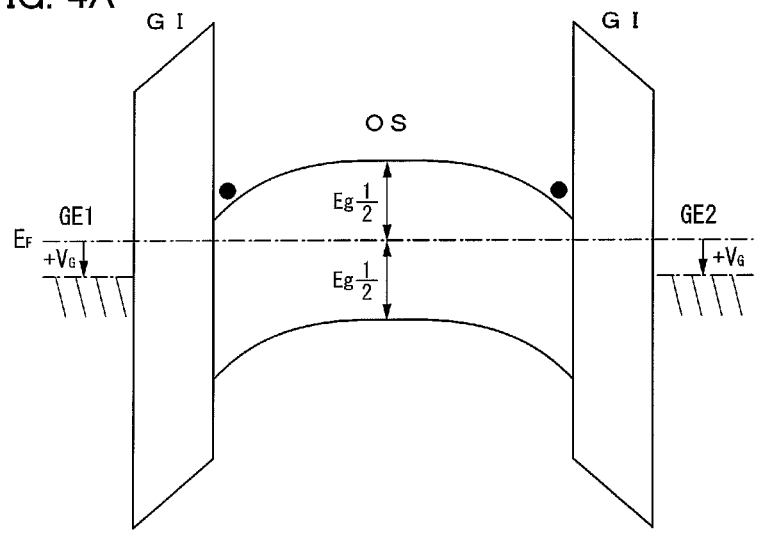
FIG. 4A is a diagram illustrating a state where a positive potential ($+V_G$) is applied to a gate (GE1)
Figure 4B:
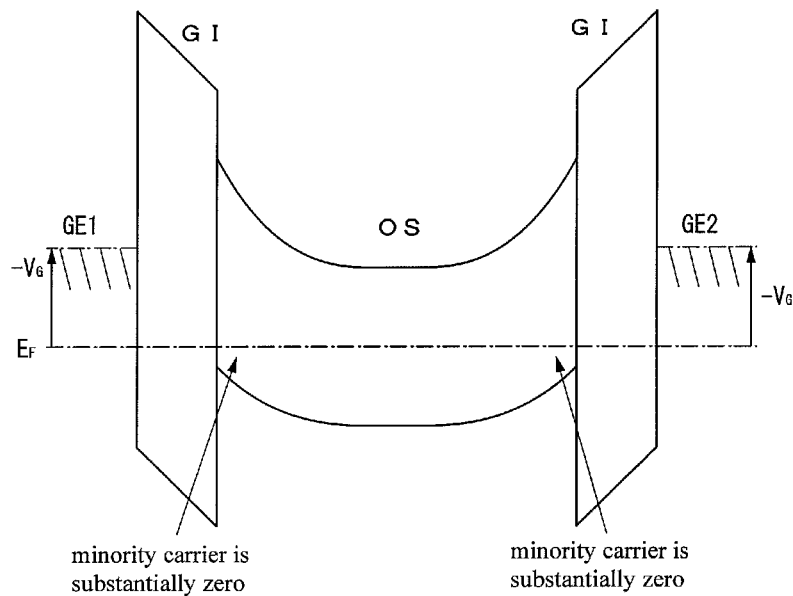
FIG. 4B is a diagram illustrating a state where a negative potential ($-V_G$) is applied to the gate (GE1).

FIGS. 4A and 4B are energy band diagrams (schematic diagrams) of a cross-section taken along line B-B' in FIG. 2. FIG. 4A illustrates a state where a positive potential ($+V_G$) is applied to the gate (GE1), that is, an on state (conducting state) where a carrier (electron) flows between a source and a drain. FIG. 4B illustrates a state where a negative potential ($-V_G$) is applied to the gate (GE1), that is, an off state (a non-conducting state or a state where a minority carrier does not flow).

Figure 5:
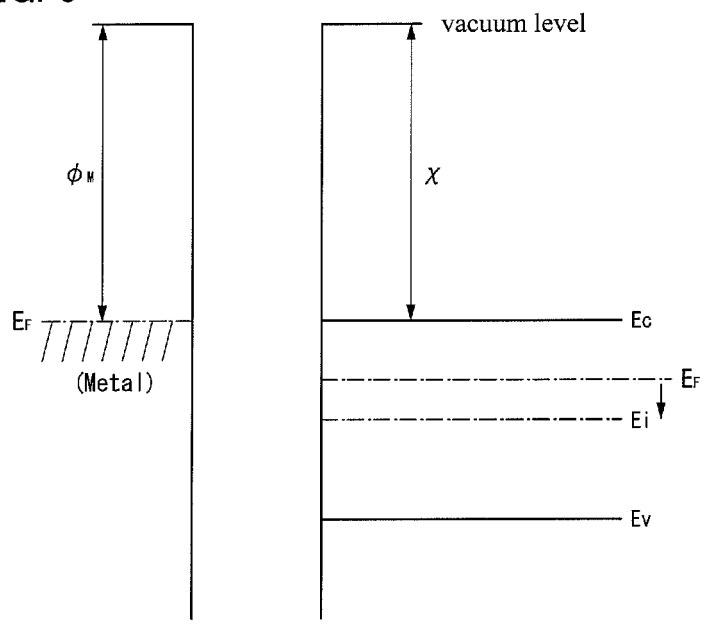
FIG. 5 is a diagram illustrating a relation between a vacuum level and work function ($\phi_M$) of metal and a relation between a vacuum level and electron affinity ($\chi$) of an oxide semiconductor.

FIG. 5 illustrates a relation between a vacuum level and work function ($\phi_M$) of metal and a relation between a vacuum level and electron affinity ($\chi$) of an oxide semiconductor.

Free electron of metal is in a degenerated state, and the Fermi level is located in a conduction band. On the other hand, a conventional oxide semiconductor film is generally of n-type, and the Fermi level ($E_F$) in that case is located close to the conduction band and is away from the intrinsic Fermi level (Ei) located in the middle of the band gap. It is known that part of hydrogen contained in the oxide semiconductor film serves as a donor and is a factor of making the oxide semiconductor film n-type.

In contrast, in the oxide semiconductor film according to this embodiment, hydrogen which is an n-type impurity is removed from the oxide semiconductor film, and the oxide semiconductor film is highly purified so that impurities that are not main components of the oxide semiconductor film may be contained as little as possible, whereby the oxide semiconductor film is an intrinsic (i-type) oxide semiconductor film or a substantially intrinsic oxide semiconductor film. That is, the highly purified oxide semiconductor film is or is a substantially i-type (intrinsic) oxide semiconductor film not by addition of impurities to be an i-type oxide semiconductor film but by removal of impurities such as hydrogen, water, hydroxyl groups, or hydride as much as possible. Accordingly, the Fermi level ($E_F$) can be made to the same level as the intrinsic Fermi level (Ei).

It is said that electron affinity ($\chi$) is 4.3 eV when the band gap (Eg) of the oxide semiconductor film is 3.15 eV. The work function of titanium (Ti) which forms the source electrode and the drain electrode is approximately equal to the electron affinity ($\chi$) of the oxide semiconductor film. In the case where titanium is used for the source electrode and the drain electrode, a Schottky barrier to electrons is not formed at the interface between the metal and the oxide semiconductor film.

In other words, an energy band diagram (schematic diagram) like FIG. 3A is obtained in the case where the metal and the oxide semiconductor film are in contact with each other when the work function of the metal ($\phi_M$) is approximately equal to the electron affinity ($\chi$) of the oxide semiconductor film.

In FIG. 3B, a black circle (●) represents an electron. When a positive potential is applied to the drain, the electron is injected into the oxide semiconductor film over a barrier (h) and flows toward the drain. In this case, the height of the barrier (h) changes depending on the gate voltage and drain voltage. When positive drain voltage is applied, the height of the barrier (h) is smaller than the height of the barrier (h) without application of voltage in FIG. 3A, namely, a half of the band gap (Eg).

In this case, as shown in FIG. 4A, the electron moves along the lowest part of the oxide semiconductor film, which is energetically stable, at an interface between the gate insulating film and the highly purified oxide semiconductor film.

In FIG. 4B, when a negative potential (reverse bias) is applied to the gate electrode (GE1), a hole which is a minority carrier is substantially zero; therefore, current is as close to zero as possible.

For example, even when the channel width W of the thin film transistor is $1\times10^4$ μm and the channel length thereof is 3 μm, off-state current is less than or equal to $10^{-13}$ A, which is extremely small, and a subthreshold swing (S value) of 0.1 V/dec. (the gate insulating film with a thickness of 100 nm) is obtained.

As described above, the oxide semiconductor film is highly purified so that impurities that are not main components of the oxide semiconductor film, typically hydrogen, water, hydroxyl groups, or hydride, may be contained as little as possible, whereby good operation of the thin film transistor can be obtained. In particular, off-state current can be reduced.

On the other hand, a horizontal thin film transistor in which a channel is formed substantially in parallel with a substrate needs a source and a drain as well as the channel, so that an area occupied by the thin film transistor in the substrate is increased, which hinders miniaturization. However, a source, a channel, and a drain are stacked in a vertical thin film transistor, whereby an occupation area in a substrate surface can be reduced. As a result of this, it is possible to miniaturize the thin film transistor.

The channel length of the vertical thin film transistor can be controlled by the thickness of the oxide semiconductor film; therefore, when the oxide semiconductor film 107 is formed to have a small thickness, a thin film transistor having a short channel length can be provided. When the channel length is reduced, series resistance of the source, the channel, and the drain can be reduced; therefore, on-state current and field-effect mobility of the thin film transistor can be increased. The gate electrode of the thin film transistor described in this embodiment has a ring shape, so that the channel width can be increased, whereby an on-state current can be increased. In addition, a thin film transistor having the highly purified oxide semiconductor film whose hydrogen concentration is reduced is in an insulating state where off-state current is extremely low and almost no current flows when the thin film transistor is off. Therefore, even when the thickness of the oxide semiconductor film is decreased to reduce the channel length of the vertical thin film transistor, a thin film transistor in which almost no off-state current in a non-conducting state flows can be provided.

As described above, using a highly purified oxide semiconductor film whose hydrogen concentration is reduced makes it possible to manufacture a thin film transistor which is suitable for higher definition and has high operation speed and in which a large amount of current can flow when the thin film transistor is on and almost no current flows when the thin film transistor is off.

(Embodiment 2)

In this embodiment, a structure of a field-effect transistor, for example a thin film transistor, which is different from that of the thin film transistor described in Embodiment 1, will be described with reference to FIGS. 6A and 6B.

Figure 6A:
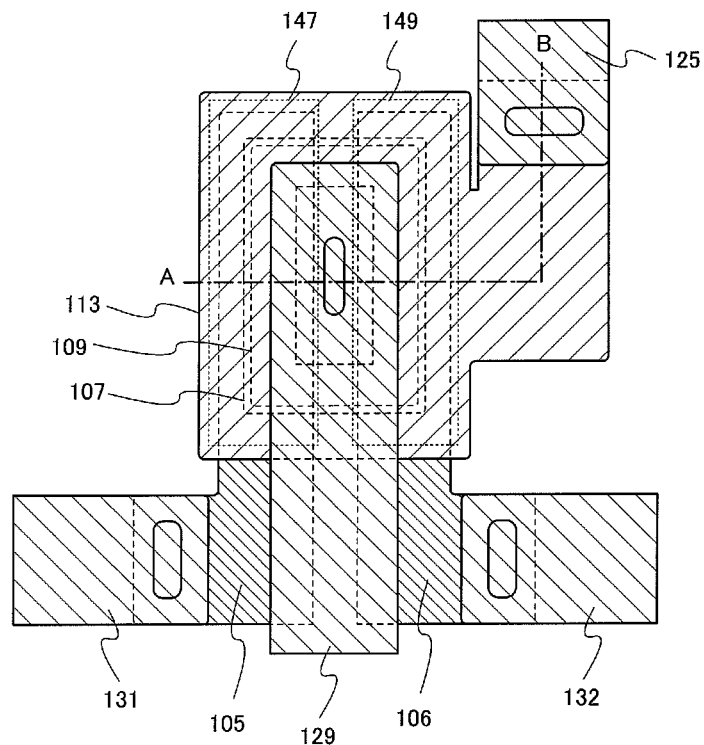
FIG. 6A is a top view illustrating a thin film transistor and FIG. 6B is a cross-sectional view illustrating the thin film transistor.
Figure 6B:
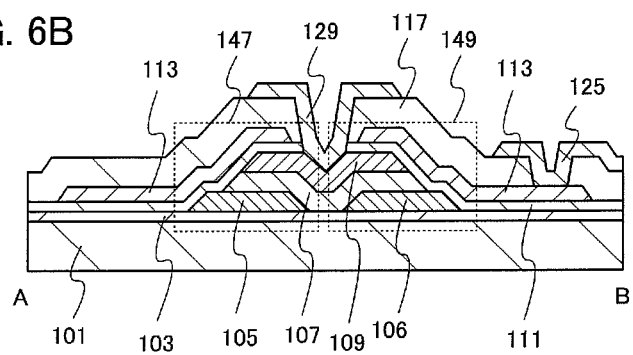

FIG. 6A is a top view of thin film transistors 147 and 149, and FIG. 6B corresponds to a cross-sectional view taken along chain line A-B in FIG. 6A.

As illustrated in FIG. 6B, the first electrode 105 and a first electrode 106, the oxide semiconductor film 107, and the second electrode 109 are stacked over the insulating film 103 formed over the substrate 101. The gate insulating film 111 is provided so as to cover the first electrodes 105 and 106, the oxide semiconductor film 107, and the second electrode 109. The third electrode 113 is provided over the gate insulating film 111. The insulating film 117 functioning as an interlayer insulating film is provided over the gate insulating film 111 and the third electrode 113. Openings are formed in the insulating film 117. The wiring 131 connected via the opening to the first electrode 105, a wiring 132 connected via the opening to the first electrode 106 (see FIG. 6A), the wiring 129 connected via the opening to the second electrode 109, and the wiring 125 connected via the opening to the third electrode 113 are formed.

The first electrode 105 functions as one of a source electrode and a drain electrode of the thin film transistor 147. The first electrode 106 functions as one of a source electrode and a drain electrode of the thin film transistor 149. The second electrode 109 functions as the other of the source electrode and the drain electrode of each of the thin film transistors 147 and 149. The third electrode 113 functions as a gate electrode of each of the thin film transistors 147 and 149.

In this embodiment, the first electrode 105 and the first electrode 106 are separated. Further, the thin film transistor 147 and the thin film transistor 149 are connected in series using the second electrode 109, the wiring 129, and the third electrode 113.

The thin film transistors 147 and 149 of this embodiment are formed using a highly purified oxide semiconductor film whose hydrogen concentration is reduced, in a manner similar to that of Embodiment 1. Therefore, good operation of the thin film transistor can be obtained. In particular, off-state current can be reduced. As a result of this, a thin film transistor which is suitable for higher definition and has high operation speed and in which a large amount of current can flow when the thin film transistor is on and almost no current flows when the thin film transistor is off can be manufactured.

(Embodiment 3)

In this embodiment, a manufacturing process of the thin film transistor in FIGS. 1A and 1B will be described with reference to FIGS. 7A to 7E.

Figure 7A:
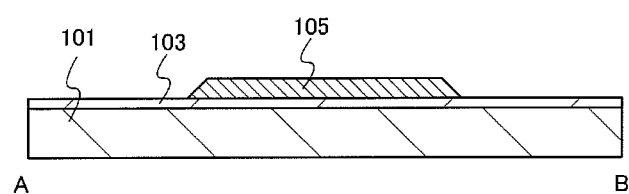
FIGS. 7A to 7E are cross-sectional views illustrating a method for manufacturing a thin film transistor.

As illustrated in FIG. 7A, the insulating film 103 is formed over the substrate 101, and the first electrode 105 is formed over the insulating film 103. The first electrode 105 functions as one of the source electrode and the drain electrode of the thin film transistor.

The insulating film 103 can be formed by a sputtering method, a CVD method, a coating method, or the like.

Note that when the insulating film 103 is formed by a sputtering method, the insulating film 103 is preferably formed while hydrogen, water, hydroxyl groups, hydride, or the like remaining in a treatment chamber is removed. This is for preventing hydrogen, water, hydroxyl groups, hydride, or the like from being contained in the insulating film 103. It is preferable to use an entrapment vacuum pump in order to remove hydrogen, water, hydroxyl groups, hydride, or the like remaining in the treatment chamber. As the entrapment vacuum pump, a cryopump, an ion pump, or a titanium sublimation pump is preferably used, for example. Further, as an evacuation unit, a cold trap may be added to a turbo molecular pump. Since impurities which are hydrogen, water, hydroxyl groups, hydride, or the like are removed from the treatment chamber which is evacuated using a cryopump, the insulating film 103 is formed in the treatment chamber when the concentration of impurities contained in the insulating film 103 can be reduced.

As a sputtering gas used for forming the insulating film 103, a high purity gas is preferably used in which impurities such as hydrogen, water, hydroxyl groups, or hydride are reduced to such a level that the impurity concentration is represented by the unit "ppm" or "ppb".

Examples of a sputtering method include an RF sputtering method in which a high-frequency power source is used for a sputtering power source, a DC sputtering method in which a direct current power source is used, and a pulsed DC sputtering method in which a bias is applied in a pulsed manner. The RF sputtering method is mainly used in the case where an insulating film is formed, whereas the DC sputtering method is mainly used in the case where a metal film is formed.

In addition, there is also a multi-source sputtering apparatus in which a plurality of targets of different materials can be set. With the multi-source sputtering apparatus, films of different materials can be formed to be stacked in the same chamber, or films of plural kinds of materials can be formed by electric discharge at the same time in the same chamber.

Alternatively, a sputtering apparatus provided with a magnet system inside the chamber and used for a magnetron sputtering method, or a sputtering apparatus used for an ECR sputtering method in which plasma generated with the use of microwaves is used without using glow discharge can be used.

Further, as a deposition method using a sputtering method, a reactive sputtering method in which a target substance and a sputtering gas component are chemically reacted with each other during deposition to form a thin compound film thereof, or a bias sputtering method in which high voltage is also applied to a substrate during deposition can be used.

As the sputtering in this specification, the above-described sputtering apparatus and the sputtering method can be employed as appropriate.

In this embodiment, the substrate 101 is transferred to the treatment chamber. A sputtering gas containing high purity oxygen, from which hydrogen, water, hydroxyl groups, hydride, or the like is removed, is introduced into the treatment chamber, and a silicon oxide film is formed as the insulating film 103 over the substrate 101 using a silicon target. Note that when the insulating film 103 is formed, the substrate 101 may be heated.

For example, the silicon oxide film is formed by an RF sputtering method under the following conditions: quartz (preferably, synthesized quartz) is used; the substrate temperature is 108° C., the distance between the substrate and the target (the T-S distance) is 60 mm; the pressure is 0.4 Pa; the high frequency power source is 1.5 kW; and the atmosphere contains oxygen and argon (oxygen flow rate of 25 sccm: argon flow rate of 25 sccm=1:1). The film thickness may be 100 nm. Note that instead of quartz (preferably, synthesized quartz), a silicon target can be used. Note that as the sputtering gas, oxygen, or a mixed gas of oxygen and argon is used.

For example, when the insulating film 103 is formed using a stacked structure, a silicon nitride film is formed using a silicon target and a sputtering gas containing high purity nitrogen from which hydrogen, water, hydroxyl groups, hydride, or the like is removed, between the silicon oxide film and the substrate. Also in this case, it is preferable that a silicon nitride film be formed while hydrogen, water, hydroxyl groups, hydride, or the like remaining in the treatment chamber is removed in a manner similar to that of the silicon oxide film. Note that in the process, the substrate 101 may be heated.

When a silicon nitride film and a silicon oxide film are stacked as the insulating film 103, a silicon nitride film and a silicon oxide film can be formed using a common silicon target in the same treatment chamber. A sputtering gas containing nitrogen is introduced into the treatment chamber first, and a silicon nitride film is formed using a silicon target provided in the treatment chamber; next, the sputtering gas containing nitrogen is switched to a sputtering gas containing oxygen and a silicon oxide film is formed using the same silicon target. The silicon nitride film and the silicon oxide film can be formed in succession without being exposed to air; therefore, impurities such as hydrogen, water, hydroxyl groups, or hydride can be prevented from being adsorbed on the surface of the silicon nitride film.

The first electrode 105 can be formed in such a manner that a conductive film is formed over the insulating film 103 by a sputtering method, a CVD method, or a vacuum evaporation method, a resist mask is formed over the conductive film in a photolithography step, and the conductive film is etched using the resist mask. Alternatively, the first electrode 105 is formed by a printing method or an ink-jet method without using a photolithography step, so that the number of steps can be reduced. Note that end portions of the first electrode 105 preferably have a tapered shape, so that the coverage with a gate insulating film to be formed later improves. When the angle formed between the end portion of the first electrode 105 and the insulating film 103 is greater than or equal to 30° and less than or equal to 60°, preferably greater than or equal to 40° and less than or equal to 50°, the coverage with the gate insulating film to be formed later can be improved.

In this embodiment, as the conductive film to serve as the first electrode 105, a titanium film is formed to have a thickness of 50 nm by a sputtering method, an aluminum film is formed to have a thickness of 100 nm, and a titanium film is formed to have a thickness of 50 nm. Next, etching is performed using the resist mask formed in the photolithography step, whereby the island-shaped first electrode 105 is formed.

Figure 7B:
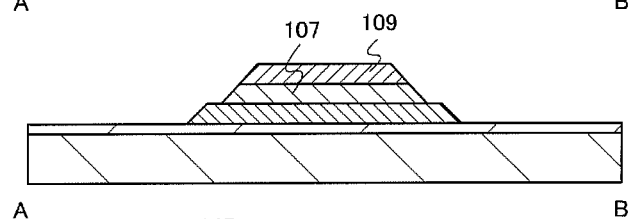

Next, as illustrated in FIG. 7B, the oxide semiconductor film 107 and the second electrode 109 are formed over the first electrode 105. The oxide semiconductor film 107 functions as a channel formation region of the thin film transistor, and the second electrode 109 functions as the other of the source electrode or the drain electrode of the thin film transistor.

Here, a method for manufacturing the oxide semiconductor film 107 and the second electrode 109 will be described.

An oxide semiconductor film is formed by a sputtering method over the substrate 101 and the first electrode 105. Next, a conductive film is formed over the oxide semiconductor film.

As pretreatment, it is preferable that the substrate 101 provided with the first electrode 105 be preheated in a preheating chamber of a sputtering apparatus and impurities such as hydrogen, water, hydroxyl groups, or hydride adsorbed on the substrate 101 be eliminated and removed so that hydrogen may be contained in the oxide semiconductor film 107 as little as possible. Note that a cryopump is preferable for an evacuation unit provided in the preheating chamber. Note that this preheating treatment can be omitted. In addition, this preheating may be performed on the substrate 101 before the formation of the gate insulating film 111, or may be performed on the substrate 101 before the formation of the third electrode 113.

Note that before the oxide semiconductor film is formed by a sputtering method, reverse sputtering in which plasma is generated by introduction of an argon gas is preferably performed to clean the surface of the first electrode 105, so that resistance at the interface between the first electrode 105 and the oxide semiconductor film can be reduced. The reverse sputtering refers to a method in which, without application of voltage to a target side, a high-frequency power source is used for application of voltage to a substrate side in an argon atmosphere to generate plasma in the vicinity of the substrate to modify a surface. Note that instead of an argon atmosphere, a nitrogen atmosphere, a helium atmosphere, or the like may be used.

In this embodiment, the oxide semiconductor film is formed by a sputtering method with the use of an In—Ga—Zn—O-based oxide semiconductor target for film formation. Alternatively, the oxide semiconductor film can be formed by a sputtering method in a rare gas (typically argon) atmosphere, an oxygen atmosphere, or a mixed atmosphere of a rare gas (typically argon) and oxygen. When a sputtering method is employed, a target containing $SiO_2$ at greater than or equal to 2 wt % and less than or equal to 10 wt % may be used.

As a sputtering gas used for forming the oxide semiconductor film, a high purity gas is preferably used in which impurities such as hydrogen, water, hydroxyl groups, or hydride are reduced to such a level that the impurity concentration is represented by the unit "ppm" or "ppb".

As a target used to form the oxide semiconductor film by a sputtering method, a target of a metal oxide containing zinc oxide as a main component can be used. As another example of a target of a metal oxide, an oxide semiconductor target for film formation containing In, Ga, and Zn (in a composition ratio, $In_2O_3:Ga_2O_3:ZnO=1:1:1$ [mol %], In:Ga:Zn=1:1:0.5 [atom %]) can be used. Alternatively, as an oxide semiconductor target for film formation containing In, Ga, and Zn, a target having such a composition ratio that In:Ga:Zn=1:1:1 [atom %] or In:Ga:Zn=1:1:2 [atom %] can be used. The filling rate of the oxide semiconductor target for film formation is greater than or equal to 90% and less than or equal to 100%, preferably, greater than or equal to 95% and less than or equal to 99.9%. An oxide semiconductor film formed using the oxide semiconductor target for film formation with high filling rate is dense.

The oxide semiconductor film is formed over the insulating film 103 and the second electrode 109 in such a manner that a sputtering gas from which hydrogen, water, hydroxyl groups, hydride, or the like is removed is introduced into the treatment chamber and a metal oxide is used as a target while the substrate is held in the treatment chamber held in a reduced-pressure state and moisture remaining in the treatment chamber is removed. It is preferable to use an entrapment vacuum pump in order to remove hydrogen, water, hydroxyl groups, hydride, or the like remaining in the treatment chamber. A cryopump, an ion pump, or a titanium sublimation pump is preferably used, for example. Further, as an evacuation unit, a cold trap may be added to a turbo molecular pump. For example, hydrogen, water, hydroxyl groups, hydride, or the like (more preferably, also a compound containing a carbon atom) are removed from the treatment chamber which is evacuated using a cryopump; therefore, the concentration of impurities contained in the oxide semiconductor film can be reduced. The oxide semiconductor film may be formed while the substrate is heated.

In this embodiment, as an example of a film formation condition of the oxide semiconductor film, the following conditions are applied: the substrate temperature is room temperature, the distance between the substrate and the target is 110 mm; the pressure is 0.4 Pa; the direct current (DC) power source is 0.5 kW; and the atmosphere contains oxygen and argon (oxygen flow rate of 15 sccm: argon flow rate of 30 sccm). Note that a pulsed direct current (DC) power source is preferable because powder substances (also referred to as particles or dust) generated in film formation can be reduced and the film thickness can be uniform. The oxide semiconductor film preferably has a thickness of greater than or equal to 30 nm and less than or equal to 3000 nm. Note that the appropriate thickness is different according to a material used for the oxide semiconductor film, and the thickness may be selected as appropriate in accordance with a material.

As the sputtering method and the sputtering apparatus that are used when the oxide semiconductor film is formed, the sputtering method and the sputtering apparatus which are employed for the insulating film 103 can be used as appropriate.

The conductive film to serve as the second electrode 109 can be formed using the material and the method which are used for the first electrode 105, as appropriate. Here, as the conductive film to serve as the second electrode 109, a 50-nm-thick titanium film, a 100-nm-thick aluminum film, and a 50-nm-thick titanium film are stacked in that order.

Next, a resist mask is formed over the conductive film in a photolithography step, the conductive film to serve as the second electrode 109 and the oxide semiconductor film to serve as the oxide semiconductor film 107 are etched using the resist mask, whereby the island-shaped second electrode 109 and the island-shaped oxide semiconductor film 107 are formed. Instead of the resist mask formed in the photolithography step, a resist mask is formed using an ink-jet method, so that the number of steps can be reduced. When the angle formed between the first electrode 105 and the end portions of the second electrode 109 and the oxide semiconductor film 107 is greater than or equal to 30° and less than or equal to 60°, preferably greater than or equal to 40° and less than or equal to 50° because of the etching, the coverage with a gate insulating film to be formed later can be improved.

Note that the etching of the conductive film and the oxide semiconductor film here may be performed using either dry etching or wet etching, or using both dry etching and wet etching. In order to form the oxide semiconductor film 107 and the second electrode 109 each having a desired shape, an etching condition (etchant, etching time, temperature, or the like) is adjusted as appropriate in accordance with a material.

When the etching rate of each of the conductive film to serve as the second electrode 109 and the oxide semiconductor film is different from that of the first electrode 105, a condition such that the etching rate of the first electrode 105 is low and the etching rate of each of the conductive film to serve as the second electrode 109 and the oxide semiconductor film is high is selected. Alternatively, when a condition such that the etching rate of the oxide semiconductor film is low and the etching rate of the conductive film to serve as the second electrode 109 is high is selected, the conductive film to serve as the second electrode 109 is etched; then, a condition such that the etching rate of the first electrode 105 is low and the etching rate of the oxide semiconductor film is high is selected.

As an etchant used for wet etching the oxide semiconductor film, a mixed solution of phosphoric acid, acetic acid, and nitric acid, an ammonia hydrogen peroxide mixture (hydrogen peroxide: ammonia: water=5:2:2), or the like can be used. In addition, ITO07N (produced by KANTO CHEMICAL CO., INC.) may also be used.

The etchant after the wet etching is removed together with the etched materials by cleaning. The waste liquid containing the etchant and the material etched off may be purified and the material may be reused. When a material such as indium contained in the oxide semiconductor film is collected from the waste liquid after the etching and reused, the resources can be efficiently used and the cost can be reduced.

As an etching gas used for dry etching the oxide semiconductor film, a gas containing chlorine (a chlorine-based gas such as chlorine ($Cl_2$), boron trichloride ($BCl_3$), silicon tetrachloride ($SiCl_4$), or carbon tetrachloride ($CCl_4$)) is preferably used.

Alternatively, a gas containing fluorine (fluorine-based gas such as carbon tetrafluoride ($CF_4$), sulfur hexafluoride ($SF_6$), nitrogen fluoride ($NF_3$), or trifluoromethane ($CHF_3$)); hydrogen bromide (HBr); oxygen ($O_2$); any of these gases to which a rare gas such as helium (He) or argon (Ar) is added; or the like can be used.

As the dry etching method, a parallel plate RIE (reactive ion etching) method or an ICP (inductively coupled plasma) etching method can be used. In order to etch the film into a desired shape, the etching condition (the amount of electric power applied to a coil-shaped electrode, the amount of electric power applied to an electrode on a substrate side, the temperature of the electrode on the substrate side, or the like) is adjusted as appropriate.

In this embodiment, the conductive film to serve as the second electrode 109 is etched using an ammonia hydrogen peroxide mixture (a mixture of ammonia, water, and hydrogen peroxide water) as an etchant, and then the oxide semiconductor film is etched using a solution in which phosphoric acid, acetic acid, and nitric acid are mixed, whereby the oxide semiconductor film 107 is formed.

Next, in this embodiment, first heat treatment is performed. The first heat treatment is performed at a temperature higher than or equal to 400° C. and lower than or equal to 750° C., preferably, higher than or equal to 400° C. and lower than a strain point of the substrate. Here, the substrate is introduced into an electric furnace which is one of heat treatment apparatuses, and heat treatment is performed on the oxide semiconductor film in an inert gas atmosphere, such as a nitrogen atmosphere or a rare gas atmosphere, at 450° C. for one hour, and then the oxide semiconductor film is not exposed to air. Accordingly, hydrogen, water, hydroxyl groups, hydride, or the like can be prevented from being mixed into the oxide semiconductor film, hydrogen concentration is reduced, and the oxide semiconductor film is highly purified, whereby an i-type oxide semiconductor film or a substantially i-type oxide semiconductor film can be obtained. That is, at least one of dehydration and dehydrogenation of the oxide semiconductor film 107 can be performed by this first heat treatment.

Note that it is preferable that in the first heat treatment, hydrogen, water, hydroxyl groups, hydride, or the like be not contained in nitrogen or a rare gas such as helium, neon, or argon. Alternatively, the purity of nitrogen or a rare gas such as helium, neon, or argon introduced into a heat treatment apparatus is preferably higher than or equal to 6N (99.9999%), more preferably higher than or equal to 7N (99.99999%) (that is, the concentration of the impurities is 1 ppm or lower, preferably 0.1 ppm or lower).

In accordance with conditions of the first heat treatment or a material for the oxide semiconductor film, the oxide semiconductor film is crystallized and changed to a microcrystalline film or a polycrystalline film in some cases. For instance, the oxide semiconductor film may be crystallized to be a microcrystalline oxide semiconductor film having a degree of crystallization of greater than or equal to 90%, or greater than or equal to 80%. Further, depending on the conditions of the first heat treatment and the material for the oxide semiconductor film, the oxide semiconductor film may become amorphous oxide semiconductor film containing no crystalline component. The oxide semiconductor film may become an oxide semiconductor film in which a microcrystalline portion (with a grain diameter greater than or equal to 1 nm and less than or equal to 20 nm, typically greater than or equal to 2 nm and less than or equal to 4 nm) is mixed into the amorphous oxide semiconductor film.

Alternatively, the first heat treatment of the oxide semiconductor film may be performed on the oxide semiconductor film before the island-shaped oxide semiconductor film is formed. In that case, the substrate is taken out from the heat apparatus after the first heat treatment, and then a photolithography step is performed.

Note that the heat treatment which has an effect of dehydration or dehydrogenation on the oxide semiconductor film may be performed after the oxide semiconductor film is formed; after the conductive film to serve as the second electrode is stacked over the oxide semiconductor film; after the gate insulating film is formed over the first electrode, the oxide semiconductor film, and the second electrode; or after the gate electrode is formed.

Figure 7C:
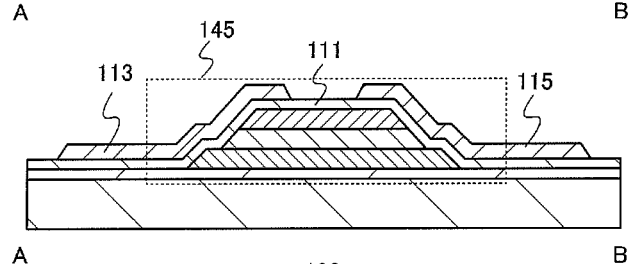

Next, as illustrated in FIG. 7C, the gate insulating film 111 is formed over the first electrode 105, the oxide semiconductor film 107, and the second electrode 109.

The i-type oxide semiconductor film (the highly purified oxide semiconductor film whose hydrogen concentration is reduced) or the substantially i-type oxide semiconductor film because of the removal of impurities is extremely sensitive to an interface state and interface charge; therefore, the interface between the oxide semiconductor film and the gate insulating film 111 is important. Accordingly, the gate insulating film 111 which is in contact with the highly purified oxide semiconductor film needs high quality.

For example, a high-quality insulating film which is dense and which has high withstand voltage can be formed by high density plasma CVD using microwaves (2.45 GHz), which is preferable. This is because when the highly purified oxide semiconductor film whose hydrogen concentration is reduced and the high-quality gate insulating film are close to each other, the interface state can be reduced and the interface characteristics can be made favorable.

Needless to say, other film formation methods, such as a sputtering method or a plasma CVD method, can be applied as long as a high-quality insulating film can be formed as the gate insulating film. A gate insulating film whose film quality is improved by the heat treatment after the gate insulating film is formed, or an insulating film whose characteristics of an interface with the oxide semiconductor film are improved may be used. In any case, not to mention good film quality as the gate insulating film, a gate insulating film in which the interface state density with the oxide semiconductor film can be reduced and a good interface can be formed may be used.

In a gate bias-temperature stress test (BT test) at 85° C., at a voltage applied to the gate of $2 \times 10^6$ V/cm for 12 hours, when impurities are added to the oxide semiconductor film, bonds between impurities and a main component of the oxide semiconductor film are cut by an intense electric field (B: bias) and high temperature (T: temperature), and generated dangling bonds cause a drift of threshold voltage (Vth).

On the other hand, impurities of the oxide semiconductor film, in particular, hydrogen, water, or the like, are removed as much as possible, and characteristics of an interface between the oxide semiconductor film and the gate insulating film are good as described above, whereby a thin film transistor which is stable to the BT test can be obtained.

When the gate insulating film 111 is formed by a sputtering method, the hydrogen concentration in the gate insulating film 111 can be reduced. When a silicon oxide film is formed by a sputtering method, a silicon target or a quartz target is used as a target and oxygen or a mixed gas of oxygen and argon is used as a sputtering gas.

Note that a halogen element (e.g. fluorine or chlorine) is contained in an insulating film provided in contact with the oxide semiconductor film, or a halogen element is contained in an oxide semiconductor film by plasma treatment in a gas atmosphere containing a halogen element in a state that the oxide semiconductor film is exposed, whereby impurities such as hydrogen, water, hydroxyl groups, or hydride (also referred to as hydrogen compound) existing in the oxide semiconductor film or at the interface between the oxide semiconductor film and the insulating film which is provided in contact with the oxide semiconductor film may be removed. When the insulating film contains a halogen element, the halogen element concentration in the insulating film may be approximately $5 \times 10^{18}$ atoms/cm$^3$ to $1 \times 10^{20}$ atoms/cm$^3$.

As described above, in the case where a halogen element is contained in the oxide semiconductor film or at the interface between the oxide semiconductor film and the insulating film which is in contact with the oxide semiconductor film and the insulating film which is provided in contact with the oxide semiconductor film is an oxide insulating film, the oxide insulating film on the side where the oxide semiconductor film is not in contact with the oxide insulating film is preferably covered with a nitrogen insulating film. That is, a silicon nitride film or the like may be provided on and in contact with the oxide insulating film which is on and in contact with the oxide semiconductor film. With such a structure, impurities such as hydrogen, water, hydroxyl groups, or hydride can be prevented from entering the oxide insulating film.

The gate insulating film 111 can have a structure in which a silicon oxide film and a silicon nitride film are stacked in that order over the first electrode 105, the oxide semiconductor film 107, and the second electrode 109. For example, a silicon oxide film (SiO$_x$ (x>0)) having a thickness of greater than or equal to 5 nm and less than or equal to 300 nm is formed as the first gate insulating film, and a silicon nitride film (SiN$_y$ (y>0)) having a thickness of greater than or equal to 50 nm and less than or equal to 200 nm is stacked as the second gate insulating film over the first gate insulating film by a sputtering method, so that a gate insulating film having a thickness of 100 nm may be formed. In this embodiment, the silicon oxide film having a thickness of 100 nm is formed by an RF sputtering method under the following conditions: the pressure is 0.4 Pa; the high-frequency power source is 1.5 kW; and the atmosphere contains oxygen and argon (oxygen flow rate of 25 sccm: argon flow rate of 25 sccm=1:1).

Next, second heat treatment may be performed in an inert gas atmosphere or an oxygen gas atmosphere (preferably, at a temperature higher than or equal to 200° C. and lower than or equal to 400° C., for example, a temperature higher than or equal to 250° C. and lower than or equal to 350° C.). Note that the second heat treatment may be performed after the formation of any one of the third electrode 113, the insulating film 117, and the wirings 125 and 129, which is performed later. Hydrogen or moisture contained in the oxide semiconductor film can be diffused into the gate insulating film by the heat treatment.

Then, the third electrode 113 functioning as a gate electrode is formed over the gate insulating film 111.

The third electrode 113 can be formed in such a way that a conductive film to serve as the third electrode 113 is formed over the gate insulating film 111 by a sputtering method, a CVD method, or a vacuum evaporation method, a resist mask is formed in a photolithography step over the conductive film, and the conductive film is etched using the resist mask.

In this embodiment, after a titanium film having a thickness of 150 nm is formed by a sputtering method, etching is performed using a resist mask formed in a photolithography step, so that the third electrode 113 is formed.

Through the above process, the thin film transistor 145 having the highly purified oxide semiconductor film 107 whose hydrogen concentration is reduced can be formed.

Figure 7D:
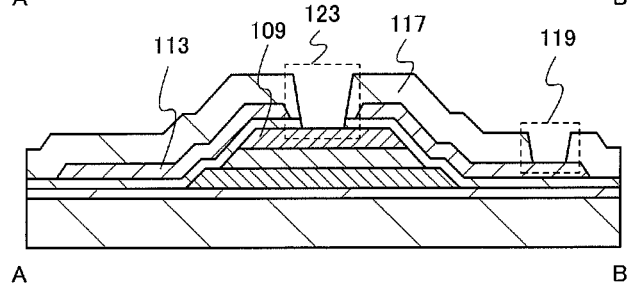

Next, as illustrated in FIG. 7D, after the insulating film 117 is formed over the gate insulating film 111 and the third electrode 113, contact holes 119 and 123 are formed.

The insulating film 117 is formed using an oxide insulating film such as a silicon oxide film, a silicon oxynitride film, an aluminum oxide film, or an aluminum oxynitride film; or a nitride insulating film such as a silicon nitride film, a silicon nitride oxide film, an aluminum nitride film, or an aluminum nitride oxide film. Alternatively, an oxide insulating film and a nitride insulating film can be stacked.

The insulating film 117 is formed by a sputtering method, a CVD method, or the like. Note that when the insulating film 117 is formed by a sputtering method, the substrate 101 is heated to a temperature of 100° C. to 400° C., a sputtering gas in which hydrogen, water, hydroxyl groups, hydride, or the like is removed and which contains high purity nitrogen is introduced, and an insulating film may be formed using a silicon target. Also in this case, an insulating film is preferably formed while hydrogen, water, hydroxyl groups, hydride, or the like remaining in the treatment chamber is removed.

Note that after the insulating film 117 is formed, heat treatment may be performed in the atmosphere at a temperature higher than or equal to 100° C. and lower than or equal to 200° C. for greater than or equal to 1 hour and less than or equal to 30 hours. A normally-off thin film transistor can be obtained by this heat treatment. Therefore, reliability of the display device and the semiconductor device can be improved.

A resist mask is formed in a photolithography step, and parts of the gate insulating film 111 and the insulating film 117 are removed by selective etching, whereby the contact holes 119 and 123 which reach the first electrode 105, the second electrode 109, and the third electrode 113 are formed.

Next, after a conductive film is formed over the gate insulating film 111 and the contact holes 119 and 123, etching is performed using a resist mask formed in a photolithography step, whereby the wirings 125 and 129 are formed. Note that a resist mask may be formed by an ink-jet method. No photomask is used when a resist mask is formed by an ink-jet method; therefore, production cost can be reduced.

The wirings 125 and 129 can be formed in a manner similar to that of the first electrode 105.

Note that a planarization insulating film for planarization may be provided between the third electrode 113 and the wiring 125. An organic material having heat resistance, such as polyimide, acrylic, benzocyclobutene, polyamide, or epoxy can be used as typical examples of the planarization insulating film. Other than such organic materials, it is also possible to use a low-dielectric constant material (a low-k material), a siloxane-based resin, phosphosilicate glass (PSG), borophosphosilicate glass (BPSG), or the like. Note that the planarization insulating film may be formed by stacking a plurality of insulating films formed from these materials.

Note that the siloxane-based resin corresponds to a resin including a Si—O—Si bond formed using a siloxane-based material as a starting material. The siloxane-based resin may include an organic group (e.g. an alkyl group or an aryl group) or a fluoro group as a substituent. Moreover, the organic group may include a fluoro group.

There is no particular limitation on the method for forming the planarization insulating film. The planarization insulating film can be formed, depending on the material, by a method such as a sputtering method, an SOG method, a spin coating method, a dipping method, a spray coating method, or a droplet discharge method (e.g. an ink-jet method, screen printing, or offset printing), or a tool such as a doctor knife, a roll coater, a curtain coater, or a knife coater.

As described above, the hydrogen concentration in the oxide semiconductor film can be reduced, and the oxide semiconductor film can be highly purified. Accordingly, the oxide semiconductor film can be stabilized. In addition, an oxide semiconductor film which has an extremely small number of minority carriers and a wide band gap can be formed by heat treatment at a temperature of lower than or equal to the glass transition temperature. Therefore, a thin film transistor can be formed using a large-area substrate; thus, the mass productivity can be improved. In addition, using a highly purified oxide semiconductor film whose hydrogen concentration is reduced makes it possible to manufacture a thin film transistor which is suitable for higher definition and has high operation speed and in which a large amount of current can flow when the thin film transistor is on and almost no current flows when the thin film transistor is off.

This embodiment can be implemented in appropriate combination with the structures described in the other embodiments.

(Embodiment 4)

In this embodiment, a field-effect transistor, for example a thin film transistor in which an oxide semiconductor film that is different from the oxide semiconductor film described in Embodiment 3 is included will be described with reference to FIGS. 7A and 7B and FIGS. 8A and 8B.

In a manner similar to that in Embodiment 3, as illustrated in FIG. 7A, the insulating film 103 and the first electrode 105 are formed over the substrate 101. Next, as illustrated in FIG. 7B, the oxide semiconductor film 107 and the second electrode 109 are formed over the first electrode 105.

Next, the first heat treatment is performed. The first heat treatment in this embodiment is different from the first heat treatment in the above embodiment. The heat treatment makes it possible to form the crystal grains in the surface of an oxide semiconductor film 151 as illustrated in FIG. 8B. In this embodiment, the first heat treatment is performed with an apparatus for heating an object to be processed by at least one of thermal conduction and thermal radiation from a heater such as a resistance heater. Here, the temperature of the heat treatment is higher than or equal to 500° C. and lower than or equal to 700° C., preferably higher than or equal to 650° C. and lower than or equal to 700° C. Note that, although there is no requirement for the upper limit of the heat treatment temperature from the essential part of the invention, the upper limit of the heat treatment temperature needs to be within the allowable temperature limit of the substrate 101. In addition, the length of time of the heat treatment is preferably greater than or equal to 1 minute and less than or equal to 10 minutes. When RTA treatment is employed for the first heat treatment, the heat treatment can be performed in a short time; thus, adverse effects of heat on the substrate 101 can be reduced. In other words, the upper limit of the heat treatment temperature can be raised in this case as compared with the case where heat treatment is performed for a long time. In addition, the crystal grains having predetermined structures can be selectively formed in the vicinity of the surface of the oxide semiconductor film.

As examples of the heat treatment apparatus that can be used in this embodiment, rapid thermal anneal (RTA) apparatuses such as a gas rapid thermal anneal (GRTA) apparatus and a lamp rapid thermal anneal (LRTA) apparatus, and the like are given. An LRTA apparatus is an apparatus for heating an object to be processed by radiation of light (an electromagnetic wave) emitted from a lamp such as a halogen lamp, a metal halide lamp, a xenon arc lamp, a carbon arc lamp, a high pressure sodium lamp, or a high pressure mercury lamp. A GRTA apparatus is an apparatus for heat treatment using a high-temperature gas. As the gas, an inert gas which does not react with an object to be processed by heat treatment, such as nitrogen or a rare gas such as argon is used.

For example, as the first heat treatment, GRTA may be performed in which the substrate is moved into an atmosphere of an inert gas such as nitrogen or a rare gas which has been heated to a temperature as high as 650° C. to 700° C.; heated for several minutes; and moved out of the highly-heated inert gas. GRTA enables high-temperature heat treatment to be performed in a short time.

Note that in the first heat treatment, it is preferable that hydrogen, water, hydroxyl groups, hydride, or the like be not contained in nitrogen or a rare gas such as helium, neon, or argon. Alternatively, the purity of nitrogen or a rare gas such as helium, neon, or argon that is introduced into the heat treatment apparatus is preferably 6N (99.9999%) or higher, more preferably 7N (99.99999%) or higher (that is, the impurity concentration is 1 ppm or lower, preferably 0.1 ppm or lower).

Note that the above heat treatment may be performed at any timing as long as it is performed after the oxide semiconductor film 107 is formed; however, in order to promote dehydration or dehydrogenation, the heat treatment is preferably performed before other components are formed on a surface of the oxide semiconductor film 107. In addition, the heat treatment may be performed plural times instead of once.

Figure 8A:
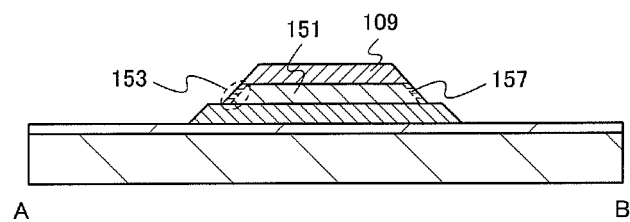
FIGS. 8A and 8B are cross-sectional views illustrating a method for manufacturing a thin film transistor.
Figure 8B:
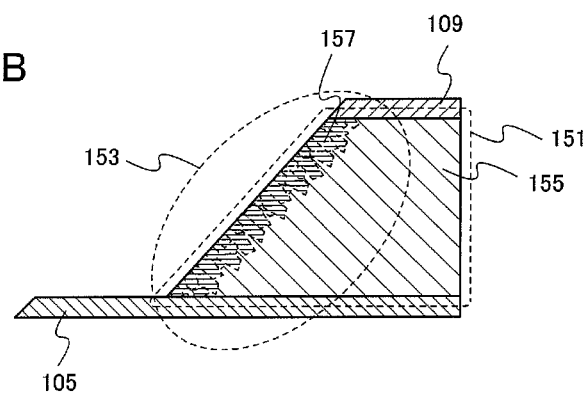

FIG. 8B is an enlarged view of a dashed line portion 153 in FIG. 8A.

The oxide semiconductor film 151 includes an amorphous region 155 that mainly contains an amorphous oxide semiconductor and crystal grains 157 that are formed in the surface of the oxide semiconductor film 151. Further, the crystal grains 157 are formed in a region that is located at a distance (depth) from the surface of the oxide semiconductor film 151 of 20 nm or less (i.e., in the vicinity of the surface). Note that the location where the crystal grains 157 are formed is not limited to the above in the case where the thickness of the oxide semiconductor film 151 is large. For example, in the case where the oxide semiconductor film 151 has a thickness of 200 nm or more, the "vicinity of a surface (surface vicinity)" means a region that is located at a distance (depth) from the surface of 10% or less of the thickness of the oxide semiconductor film.

Here, the amorphous region 155 mainly contains an amorphous oxide semiconductor film. Note that the word "mainly" means, for example, a state where one occupies 50% or more of a region. In this case, it means a state where the amorphous oxide semiconductor film occupies 50% or more at volume % (or weight %) of the amorphous region 155. In other words, the amorphous region in some cases includes crystals of an oxide semiconductor film other than an amorphous oxide semiconductor film, and the percentage of the content thereof is preferably less than 50% at volume % (or weight %). However, the percentage of the content is not limited to the above.

In the case where an In—Ga—Zn—O-based oxide semiconductor is used as a material for the oxide semiconductor film, the composition of the above amorphous region 155 is preferably set so that the Zn content (atomic %) is less than the In or Ga content (atomic %) for the reason that such composition makes it easy for the crystal grains 157 which have predetermined composition to be formed.

After that, a gate insulating film and a third electrode that functions as a gate electrode are formed in a manner similar to that of Embodiment 3 to complete the thin film transistor.

The vicinity of the surface of the oxide semiconductor film 151, which is in contact with the gate insulating film, serves as a channel. The crystal grains are included in the region that serves as a channel, whereby the resistance between a source, the channel, and a drain is reduced and carrier mobility is increased. Thus, the field-effect mobility of the thin film transistor in which the oxide semiconductor film 151 is included is increased, which leads to favorable electric characteristics of the thin film transistor.

Further, the crystal grains 157 are more stable than the amorphous region 155; thus, when the crystal grains 157 are included in the vicinity of the surface of the oxide semiconductor film 151, entry of impurities (e.g., hydrogen, water, hydroxyl groups, or hydride) into the amorphous region 155 can be reduced. Thus, the reliability of the oxide semiconductor film 151 can be improved.

Through the above-described steps, the concentration of hydrogen in the oxide semiconductor film can be reduced and the oxide semiconductor film is highly purified. Thus, stabilization of the oxide semiconductor film can be achieved. In addition, heat treatment at a temperature of lower than or equal to the glass transition temperature makes it possible to form an oxide semiconductor film with a wide band gap in which the number of minority carriers is extremely small. Thus, thin film transistors can be manufactured using a large substrate, which leads to the enhancement of mass production. Further, the use of the oxide semiconductor film in which the hydrogen concentration is reduced and the purity is increased makes it possible to manufacture a thin film transistor which is suitable for increase in definition and has high operation speed and in which a large amount of current can flow when the thin film transistor is on and almost no current flows when the thin film transistor is off.

This embodiment can be implemented in appropriate combination with the structures described in the other embodiments.

(Embodiment 5)

In this embodiment, a manufacturing process of the thin film transistor illustrated in FIGS. 1A and 1B will be described with reference to FIGS. 7A to 7E.

In a manner similar to that of Embodiment 3, as illustrated in FIG. 7A, the first electrode 105 is formed over the substrate 101.

Next, as illustrated in FIG. 7B, the oxide semiconductor film 107 and the second electrode 109 are formed over the first electrode 105.

Note that before the oxide semiconductor film is formed by a sputtering method, reverse sputtering in which plasma is generated by introduction of an argon gas is preferably performed so that dust or an oxide film which is attached to a surface of the first electrode 105 is removed, in which case the resistance at an interface between the first electrode 105 and the oxide semiconductor film can be reduced. Note that instead of an argon atmosphere, a nitrogen atmosphere, a helium atmosphere, or the like may be used.

The oxide semiconductor film is formed over the substrate 101 and the first electrode 105 by a sputtering method. Then, a conductive film is formed over the oxide semiconductor film.

In this embodiment, the oxide semiconductor film is formed by a sputtering method using an In—Ga—Zn—O-based oxide semiconductor target for formation. In this embodiment, the substrate is held in a treatment chamber which is maintained in a reduced pressure state, and the substrate is heated to room temperature or a temperature lower than 400° C. Then, a sputtering gas from which hydrogen, water, hydroxyl groups, hydride, or the like is removed is introduced while hydrogen, water, hydroxyl groups, hydride, or the like remaining in the treatment chamber is removed, whereby the oxide semiconductor film is formed over the substrate 101 and the first electrode 105. An entrapment vacuum pump is preferably used for removing hydrogen, water, hydroxyl groups, hydride, or the like remaining in the treatment chamber. For example, a cryopump, an ion pump, or a titanium sublimation pump is preferably used. An evacuation unit may be a turbo pump provided with a cold trap. In the treatment chamber evacuated with a cryopump, for example, hydrogen, water, hydroxyl groups, hydride (more preferably a compound containing a carbon atom), or the like is eliminated; thus, the concentration of impurities contained in the oxide semiconductor film formed in the treatment chamber can be reduced. Further, sputtering formation is performed while hydrogen, water, hydroxyl groups, hydride, or the like remaining in the treatment chamber is removed with a cryopump, whereby an oxide semiconductor film in which impurities such as hydrogen atoms and water are reduced can be formed even at a substrate temperature of room temperature to a temperature lower than 400° C.

In this embodiment, film formation conditions that the distance between the substrate and the target is 100 mm, the pressure is 0.6 Pa, the direct-current (DC) power supply is 0.5 kW, and the atmosphere is an oxygen atmosphere (the proportion of oxygen flow is 100%) are employed. Note that a pulsed direct-current (DC) power supply is preferably used, in which case powdery substances (also referred to as particles or dust) which are generated at the time of film formation can be reduced and the film thickness can be uniform. The oxide semiconductor film preferably has a thickness of greater than or equal to 30 nm and less than or equal to 3000 nm. Note that the appropriate thickness of the oxide semiconductor film differs depending on the material to be used; therefore, the thickness may be determined as appropriate in accordance with the material.

Note that the sputtering method and sputtering apparatus that are used for forming the insulating film 103 can be used as appropriate as a sputtering method and a sputtering apparatus for forming the oxide semiconductor film.

Next, a conductive film that serves as the second electrode 109 is formed using the material and method that are used for forming the first electrode 105.

Next, in a manner similar to that of Embodiment 3, the conductive film that serves as the second electrode 109 and the oxide semiconductor film that serves as the oxide semiconductor film 107 are etched so that the island-shaped second electrode 109 and the island-shaped oxide semiconductor film 107 are formed. The etching conditions (such as an etchant, etching time, and temperature) are adjusted as appropriate in accordance with the material in order to form the oxide semiconductor film 107 and the second electrode 109 with desired shapes.

Next, as illustrated in FIG. 7C, in a manner similar to that of Embodiment 3, the gate insulating film 111 is formed over the first electrode 105, the oxide semiconductor film 107, and the second electrode 109. As the gate insulating film 111, a gate insulating film that has a favorable characteristic of an interface between the gate insulating film 111 and the oxide semiconductor film 107 is preferable. The gate insulating film 111 is preferably formed by high-density plasma CVD method using a microwave (2.45 GHz), in which case the gate insulating film 111 can be dense and can have high withstand voltage and high quality. Another method such as a sputtering method or a plasma CVD method can be employed as long as the method enables a good-quality insulating film to be formed as the gate insulating film.

Note that before the gate insulating film 111 is formed, reverse sputtering is preferably performed so that resist residues and the like attached to at least a surface of the oxide semiconductor film 107 are removed.

Further, before the gate insulating film 111 is formed, hydrogen, water, hydroxyl groups, hydride, or the like attached to an exposed surface of the oxide semiconductor film may be removed by plasma treatment using a gas such as $N_2O$, $N_2$, or Ar. Alternatively, plasma treatment may be performed using a mixed gas of oxygen and argon. In the case where plasma treatment is performed, the gate insulating film 111 which is to be in contact with part of the oxide semiconductor film is preferably formed without being exposed to air.

Further, it is preferable that the substrate 101 over which components up to and including the first electrode 105 to the second electrode 109 are formed be preheated in a preheating chamber in a sputtering apparatus as pretreatment to eliminate and evacuate hydrogen, water, hydroxyl groups, hydride, or the like adsorbed on the substrate 101 so that hydrogen, water, hydroxyl groups, hydride, or the like is contained as little as possible in the gate insulating film 111. Alternatively, it is preferable that the substrate 101 be preheated in a preheating chamber in a sputtering apparatus to eliminate and evacuate impurities such as hydrogen, water, hydroxyl groups, hydride, or the like adsorbed on the substrate 101 after the gate insulating film 111 is formed. Note that the temperature of the preheating is higher than or equal to 100° C. and lower than or equal to 400° C., preferably higher than or equal to 150° C. and lower than or equal to 300° C. A cryopump is preferable as an evacuation unit provided in the preheating chamber. Note that this preheating treatment can be omitted.

The gate insulating film 111 can have a structure in which a silicon oxide film and a silicon nitride film are stacked in that order over the first electrode 105, the oxide semiconductor film 107, and the second electrode 109. For example, a silicon oxide film ($SiO_x$ (x>0)) with a thickness of greater than or equal to 5 nm and less than or equal to 300 nm is formed as a first gate insulating film by a sputtering method and a silicon nitride film ($SiN_y$ (y>0)) with a thickness of greater than or equal to 50 nm and less than or equal to 200 nm is stacked as a second gate insulating film over the first gate insulating film, whereby the gate insulating film 111 is formed.

Next, as illustrated in FIG. 7C, in a manner similar to that of Embodiment 3, the third electrode 113 that functions as a gate electrode is formed over the gate insulating film 111.

Through the above-described steps, the thin film transistor 145 in which the oxide semiconductor film 107 in which the hydrogen concentration is reduced is included can be manufactured.

Hydrogen, water, hydroxyl groups, hydride, or the like remaining in a reaction atmosphere is removed in forming the oxide semiconductor film as described above, whereby the concentration of hydrogen in the oxide semiconductor film can be reduced. Thus, stabilization of the oxide semiconductor film can be achieved.

Next, as illustrated in FIG. 7D, in a manner similar to that of Embodiment 3, the contact holes 119 and 123 are formed after the insulating film 117 is formed over the gate insulating film 111 and the third electrode 113.

Figure 7E:
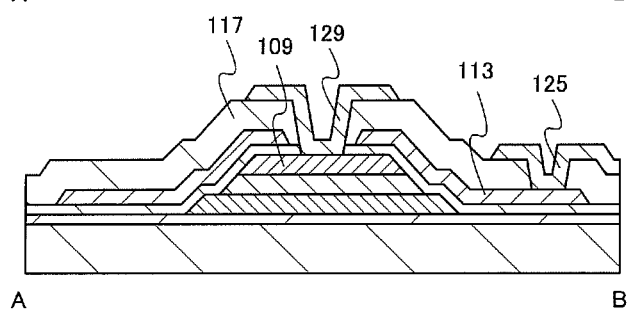

Next, as illustrated in FIG. 7E, in a manner similar to that of Embodiment 3, the wirings 125 and 129 are formed.

Note that in a manner similar to that of Embodiment 3, after the formation of the insulating film 117, heat treatment may be further performed at a temperature higher than or equal to 100° C. and lower than or equal to 200° C. in air for greater than or equal to 1 hour and less than or equal to 30 hours. This heat treatment enables a normally-off thin film transistor to be obtained. Thus, the reliability of a display device or a semiconductor device can be improved.

Note that a planarization insulating film for planarization may be provided between the third electrode 113 and the wirings 125 and 129.

Hydrogen, water, hydroxyl groups, hydride, or the like remaining in a reaction atmosphere is removed in forming the oxide semiconductor film as described above, whereby the concentration of hydrogen in the oxide semiconductor film can be reduced and the purity of the oxide semiconductor film can be increased. Thus, stabilization of the oxide semiconductor film can be achieved. In addition, heat treatment at a temperature lower than or equal to the glass transition temperature makes it possible to form an oxide semiconductor film with a wide band gap in which the number of minority carriers is extremely small. Thus, thin film transistors can be manufactured using a large substrate, which leads to the enhancement of mass production. Further, the use of the oxide semiconductor film in which the hydrogen concentration is reduced and the purity is increased makes it possible to manufacture a thin film transistor which is suitable for increase in definition and has high operation speed and in which a large amount of current can flow when the thin film transistor is on and almost no current flows when the thin film transistor is off.

This embodiment can be implemented in appropriate combination with the structures described in the other embodiments.

(Embodiment 6)

In this embodiment, an element substrate and a pixel structure in a display device in which the field-effect transistor, for example the thin film transistor described in any of the above embodiments is used will be described with reference to FIG. 9 and FIG. 10.

Figure 9:
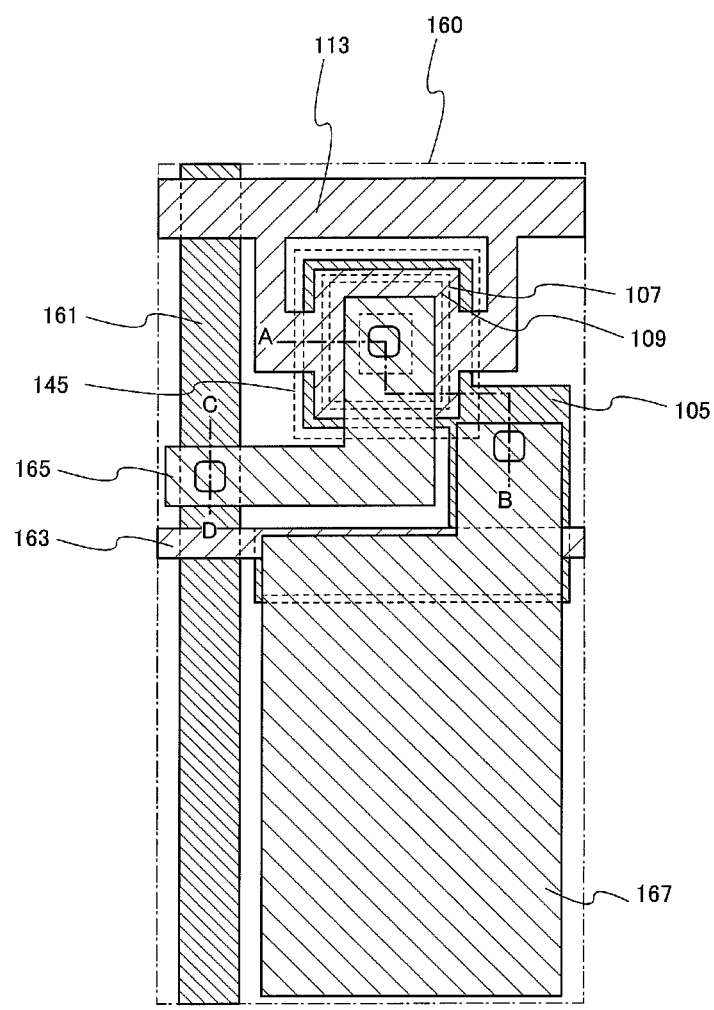
FIG. 9 is a top view illustrating a pixel of a display device.
Figure 10:
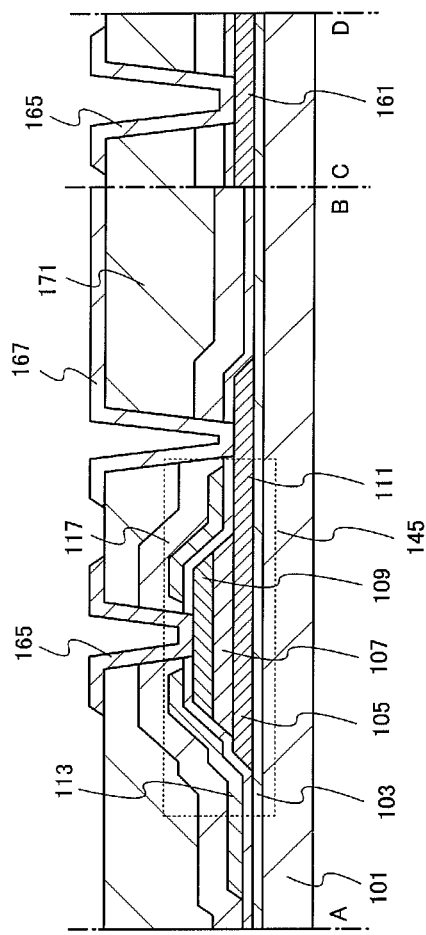
FIG. 10 is a cross-sectional view illustrating a pixel of a display device.

FIG. 9 is a top view of a pixel 160 in a display portion in a display device. FIG. 10 is a cross-sectional view taken along dashed line A-B and dashed line C-D in FIG. 9.

Although the thin film transistor 145 described in Embodiment 1 is used as a pixel thin film transistor for controlling a potential of a pixel electrode for description in this embodiment, any of the thin film transistors described in the other embodiments can be used as appropriate. The first electrode 105 that functions as one of a source electrode and a drain electrode of the thin film transistor 145 is connected to a pixel electrode 167. The second electrode 109 that functions as the other of the source electrode and the drain electrode of the thin film transistor 145 is connected to a signal line 161 through a conductive film 165. In addition, a capacitor wiring 163 is formed of the layer that is used for forming the first electrode 105. The conductive film 165 and the pixel electrode 167 are formed over a planarization insulating film 171 for planarization.

Note that in the thin film transistors described in Embodiments 1 to 6, the oxide semiconductor film in which the hydrogen concentration is reduced and the purity is increased is used; thus, off-state current of the thin film transistors is low. Thus, a capacitor for holding signal voltage applied to the pixel electrode does not have to be additionally provided. In other words, the capacitor wiring 163 does not need to be provided; thus, the aperture ratio of the pixel can be increased.

The planarization insulating film 171 can be formed using the material of the planarization insulating film, which is described in Embodiment 3, as appropriate.

The pixel electrode 167 is formed using a conductive film that is favorable to each display device.

The element substrate described in this embodiment can be used as appropriate in other display devices such as a liquid crystal display device, a light-emitting display device, and an electrophoretic display device. In addition, the structure of the pixel is not limited to the structure illustrated in FIG. 9 and FIG. 10, and a thin film transistor, a diode, and a capacitor can be provided as appropriate.

Since the thin film transistors described in Embodiments 1 to 5 can be miniaturized, a high-definition display device can be manufactured using an element substrate described in this embodiment.

This embodiment can be implemented in appropriate combination with the structures described in the other embodiments.

(Embodiment 7)

In this embodiment, the case where a thin film transistor is manufactured and the thin film transistor is used in a pixel portion and a peripheral circuit portion (e.g., a driver circuit) so that a semiconductor device having a display function (a display device) is manufactured will be described. Part of or all the peripheral circuit portion is formed over a substrate where the pixel portion is formed, whereby a system-on-panel can be realized.

The display device includes a display element. As the display element, a liquid crystal element (also referred to as a liquid crystal display element), a light-emitting element (also referred to as a light-emitting display element), or the like can be used. The light-emitting element includes, in its category, an element whose luminance is controlled by current or voltage, and specifically includes, in its category, an inorganic electroluminescent (EL) element, an organic EL element, and the like. Further, a display medium whose contrast is changed by an electric effect, such as electronic ink, may be used.

In addition, the display device includes a panel in which the display element is sealed, and a module in which an IC including a controller or the like is mounted on the panel. Furthermore, an element substrate included in a display device is provided with a unit for supplying current to the display element in each of pixel portions. Specifically, the element substrate may be in a state after only a pixel electrode of the display element is formed, or in a state after a conductive layer to be a pixel electrode is formed and before the conductive layer is etched.

Figures 1, 11A:
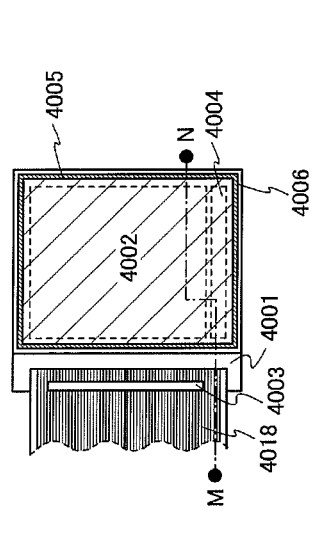
Figures 2, 11A:
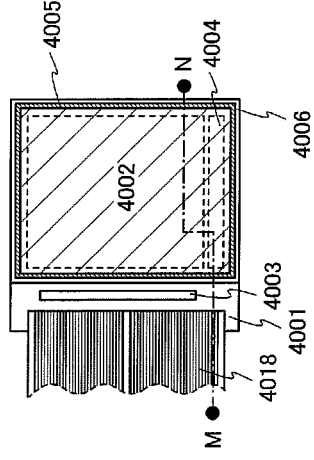
Figure 11B:
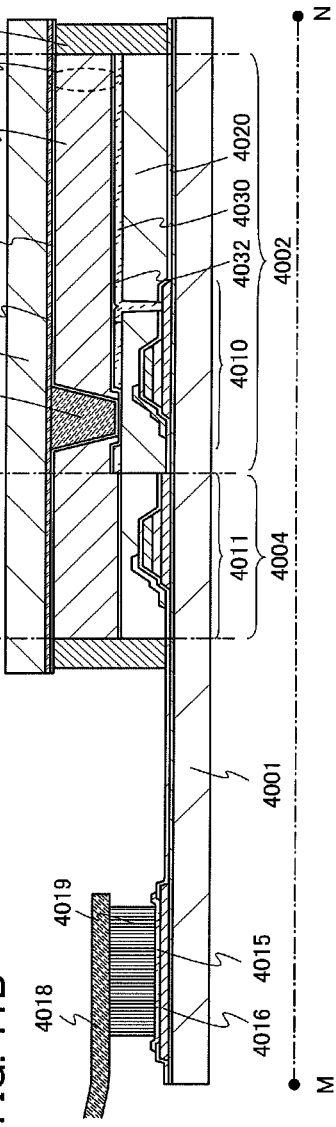
FIG. 11B is a cross-sectional view of a semiconductor device.

Hereinafter, in this embodiment, an example of a liquid crystal display device will be described. FIGS. 11A1 and 11A2 are plan views and FIG. 11B is a cross-sectional view of a panel in which thin film transistors 4010 and 4011 and a liquid crystal element 4013 that are formed over a first substrate 4001 are sealed by a second substrate 4006 and a sealant 4005. Here, FIGS. 11A1 and 11A2 are each a plan view and FIG. 11B is a cross-sectional view taken along line M-N in FIGS. 11A1 and 11A2.

The sealant 4005 is provided so as to surround a pixel portion 4002 and a scan line driver circuit 4004 that are provided over the first substrate 4001. The second substrate 4006 is provided over the pixel portion 4002 and the scan line driver circuit 4004. In other words, the pixel portion 4002 and the scan line driver circuit 4004 are sealed together with a liquid crystal layer 4008, by the first substrate 4001, the sealant 4005, and the second substrate 4006. Further, a signal line driver circuit 4003 that is formed using a single crystal semiconductor or a polycrystalline semiconductor over a substrate separately prepared is mounted in a region that is different from the region surrounded by the sealant 4005 over the first substrate 4001.

Note that there is no particular limitation on the connection method of a driver circuit that is separately formed, and a COG method, a wire bonding method, a TAB method, or the like can be used as appropriate. FIG. 11A-1 illustrates an example of mounting the signal line driver circuit 4003 by a COG method, and FIG. 11A-2 illustrates an example of mounting the signal line driver circuit 4003 by a TAB method.

Further, the pixel portion 4002 and the scan line driver circuit 4004 provided over the first substrate 4001 each include a plurality of thin film transistors. FIG. 11B illustrates the thin film transistor 4010 included in the pixel portion 4002 and the thin film transistor 4011 included in the scan line driver circuit 4004. An insulating film 4020 is provided over the thin film transistors 4010 and 4011.

As the thin film transistors 4010 and 4011, any of the thin film transistors that are described in the above embodiments, or the like can be employed.

A pixel electrode 4030 included in the liquid crystal element 4013 is electrically connected to the thin film transistor 4010. A counter electrode 4031 of the liquid crystal element 4013 is provided for the second substrate 4006. The liquid crystal element 4013 is constituted by the pixel electrode 4030, the counter electrode 4031, and the liquid crystal layer 4008. Note that the pixel electrode 4030 and the counter electrode 4031 are provided with an insulating film 4032 and an insulating film 4033, respectively, each of which functions as an alignment film. The liquid crystal layer 4008 is sandwiched between the pixel electrode 4030 and the counter electrode 4031 with the insulating films 4032 and 4033 interposed therebetween.

Note that the substrate 101 that is described in Embodiment 1 can be used as the first substrate 4001 and the second substrate 4006, as appropriate. Alternatively, metal (typically stainless steel), ceramic, plastic, or the like can be used. As plastic, a fiberglass-reinforced plastics (FRP) substrate, a polyvinyl fluoride (PVF) film, a polyester film, an acrylic resin film, or the like can be used. Further alternatively, a sheet in which aluminum foil is sandwiched by PVF films or polyester films can be used.

A columnar spacer 4035 is provided in order to control the distance (cell gap) between the pixel electrode 4030 and the counter electrode 4031. The columnar spacer 4035 can be obtained by selective etching of an insulating film. Note that a spherical spacer may be used instead of the columnar spacer. The counter electrode 4031 is electrically connected to a common potential line formed over the same substrate as the thin film transistor 4010. For example, the counter electrode 4031 can be electrically connected to the common potential line through conductive particles provided between the pair of substrates. Note that the conductive particles are preferably contained in the sealant 4005.

Alternatively, a liquid crystal showing a blue phase for which an alignment film is unnecessary may be used. A blue phase is one of the liquid crystal phases, which is generated just before a cholesteric phase changes into an isotropic phase while temperature of cholesteric liquid crystal is increased. Since the blue phase is only generated within a narrow range of temperatures, a liquid crystal composition containing a chiral agent at 5 wt % or more is preferably used. Thus, the temperature range can be improved. The liquid crystal composition which includes a liquid crystal showing a blue phase and a chiral agent has a small response time of 10 μs to 100 μs, has optical isotropy, which makes the alignment process unneeded, and has a small viewing angle dependence.

Although an example of a transmissive liquid crystal display device is described in this embodiment, the present invention is not limited thereto, and a reflective liquid crystal display device or a semi-transmissive liquid crystal display device may be formed.

As the example of the liquid crystal display device described in this embodiment, a polarizing plate is provided on the outer surface of the substrate (on the viewer side) and a coloring layer and an electrode used for a display element are provided on the inner surface of the substrate; however, the polarizing plate may be provided on the inner surface of the substrate. The stacked structure of the polarizing plate and the coloring layer is not limited to this embodiment and may be set as appropriate depending on materials of the polarizing plate and the coloring layer or conditions of manufacturing process. Further, a black mask (a black matrix) may be provided as a light-shielding film.

Although the thin film transistor obtained in any of the above embodiments is covered with the insulating film 4020 in order to reduce surface unevenness caused by the thin film transistor in this embodiment, the invention disclosed is not limited to this structure.

The insulating film 4020 can be formed using the material of the planarization insulating film, which is described in Embodiment 3, as appropriate.

The pixel electrode 4030 and the counter electrode 4031 can be formed using a light-transmitting conductive material such as indium oxide containing tungsten oxide, indium zinc oxide containing tungsten oxide, indium oxide containing titanium oxide, indium tin oxide containing titanium oxide, indium tin oxide (hereinafter referred to as ITO), indium zinc oxide, or indium tin oxide to which silicon oxide is added.

A conductive composition containing a conductive high molecule (also referred to as a conductive polymer) may be used for the pixel electrode 4030 and the counter electrode 4031. The pixel electrode formed of the conductive composition preferably has a sheet resistance of less than or equal to $1.0 \times 10^4$ Ω/square and a transmittance of greater than or equal to 70% at a wavelength of 550 nm. Furthermore, the resistivity of the conductive high molecule contained in the conductive composition is preferably less than or equal to 0.1 Ω·cm.

As the conductive high molecule, a so-called π-electron conjugated conductive polymer can be used. For example, polyaniline or a derivative thereof, polypyrrole or a derivative thereof, polythiophene or a derivative thereof, a copolymer of two or more kinds of them, and the like can be given.

A variety of signals are supplied from an FPC 4018 to the signal line driver circuit 4003, the scan line driver circuit 4004, the pixel portion 4002, or the like.

In addition, a connection terminal electrode 4015 is formed from the same conductive film as the pixel electrode 4030 included in the liquid crystal element 4013, and a terminal electrode 4016 is formed from the same conductive film as a source or drain electrode of the thin film transistors 4010 and 4011.

The connection terminal electrode 4015 is electrically connected to a terminal included in the FPC 4018 through an anisotropic conductive film 4019.

Note that FIGS. 11A1, 11A2 and 11B illustrate the example in which the signal line driver circuit 4003 is formed separately and then mounted on the first substrate 4001; however, this embodiment is not limited to this structure. The scan line driver circuit may be separately formed and then mounted, or only part of the signal line driver circuit or part of the scan line driver circuit may be separately formed and then mounted.

Since the thin film transistors described in Embodiments 1 to 5 can be miniaturized, a high-definition liquid crystal display device can be manufactured.

This embodiment can be implemented in appropriate combination with the structures described in the other embodiments.

(Embodiment 8)

In this embodiment, active matrix electronic paper that is an example of a semiconductor device will be described with reference to FIG. 12. A thin film transistor 650 used in a semiconductor device can be manufactured in a manner similar to that of any of the thin film transistors described in the above embodiments.

Figure 12:
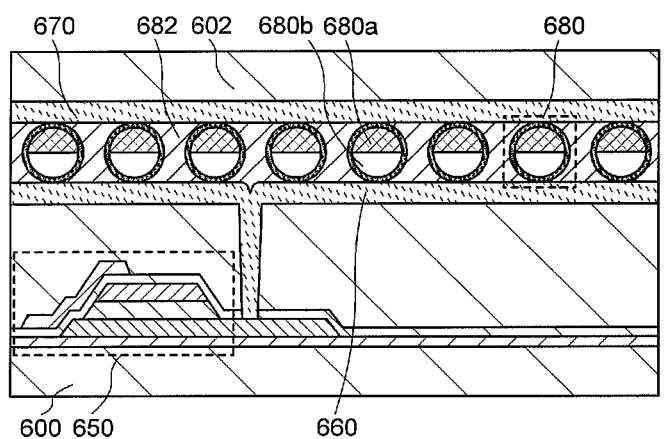
FIG. 12 is a cross-sectional view of a semiconductor device.

The electronic paper illustrated in FIG. 12 is an example of a display device in which a twist ball display method is employed. The twist ball display method refers to a method in which spherical particles each colored in black and white are arranged between a first electrode and a second electrode, and a potential difference is generated between the first electrode and the second electrode, whereby orientation of twist balls is controlled so that display is performed.

The thin film transistor 650 provided over a substrate 600 is a thin film transistor according to one embodiment of the invention disclosed and has a structure in which an oxide semiconductor film is sandwiched between a source or drain electrode which is located above the oxide semiconductor film and a source or drain electrode which is located below the oxide semiconductor film. Note that the source or drain electrode is electrically connected to a first electrode 660 through a contact hole formed in an insulating film. A substrate 602 is provided with a second electrode 670. Twist balls 680 each having a black region 680a and a white region 680b are provided between the first electrode 660 and the second electrode 670. A space around the twist balls 680 is filled with a filler 682 such as a resin (see FIG. 12). In FIG. 12, the first electrode 660 corresponds to a pixel electrode, and the second electrode 670 corresponds to a common electrode. The second electrode 670 is electrically connected to a common potential line provided over the substrate where the thin film transistor 650 is formed.

Instead of the twist ball, an electrophoretic display element can be used. In that case, for example, a microcapsule having a diameter of approximately 10 μm to 200 μm in which transparent liquid, positively-charged white microparticles, and negatively-charged black microparticles are encapsulated, is used. When an electric field is applied by the first electrode and the second electrode, the white microparticles and the black microparticles move to opposite sides from each other, whereby a white or black image is displayed. The electrophoretic display element has higher reflectance than a liquid crystal display element; thus, an auxiliary light is unnecessary and a display portion can be recognized in a place where brightness is not sufficient. In addition, there is an advantage that an image that has been displayed once can be maintained even when power is not supplied to the display portion.

As described above, the use of the invention disclosed makes it possible to manufacture high-performance electronic paper. This embodiment can be implemented in appropriate combination with the structures described in the other embodiments.

Since the thin film transistors described in Embodiments 1 to 5 can be miniaturized, high-definition electronic paper can be manufactured.

(Embodiment 9)

In this embodiment, an example of a light-emitting display device will be described as a semiconductor device. As a display element included in a display device, a light-emitting element utilizing electroluminescence will be described here. Light-emitting elements utilizing electroluminescence are classified according to whether a light-emitting material is an organic compound or an inorganic compound. In general, the former is referred to as an organic EL element, and the latter is referred to as an inorganic EL element.

In an organic EL element, by application of voltage to a light-emitting element, electrons and holes are separately injected from a pair of electrodes into a layer containing a light-emitting organic compound, and current flows. Then, the carriers (electrons and holes) recombine, so that light is emitted. Owing to this mechanism, the light-emitting element is called a current-excitation light-emitting element.

The inorganic EL elements are classified, according to their element structures, into a dispersion-type inorganic EL element and a thin-film inorganic EL element. A dispersion-type inorganic EL element has a light-emitting layer where particles of a light-emitting material are dispersed in a binder, and its light emission mechanism is donor-acceptor recombination type light emission that utilizes a donor level and an acceptor level. A thin-film inorganic EL element has a structure where a light-emitting layer is sandwiched between dielectric layers, which are further sandwiched between electrodes, and its light emission mechanism is localized type light emission that utilizes inner-shell electron transition of metal ions. Note that an example in which an organic EL element is used as a light-emitting element is described here.

Figure 13A:
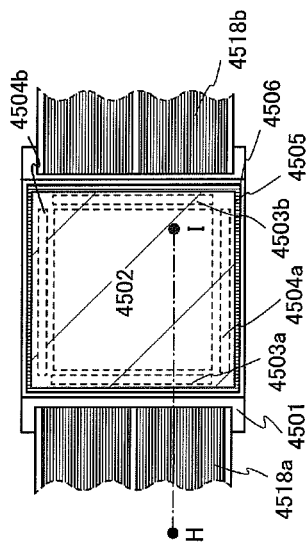
FIG. 13A is a plan view of a semiconductor device and FIG. 13B is a cross-sectional view of the semiconductor device.
Figure 13B:
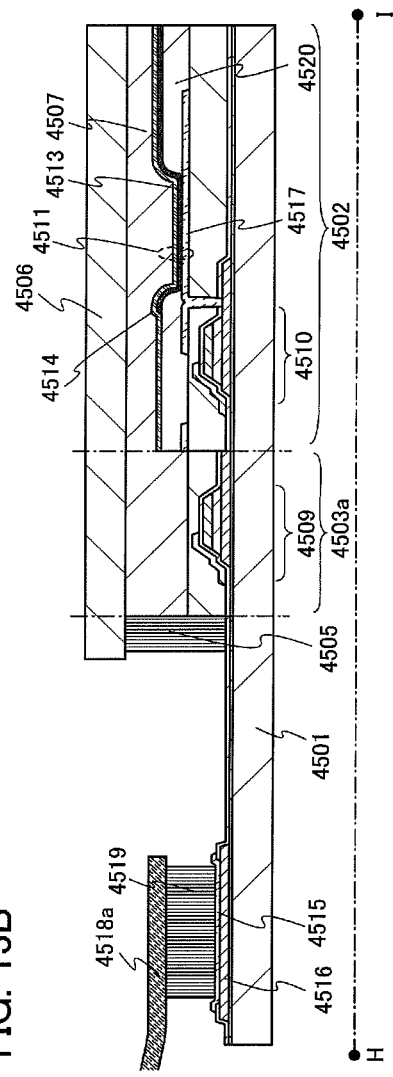

Next, the appearance and a cross section of a light-emitting display panel (also referred to as a light-emitting panel), which corresponds to one embodiment of the semiconductor device, are described with reference to FIGS. 13A and 13B. FIG. 13A is a plan view and FIG. 13B is a cross-sectional view of a panel in which thin film transistors 4509 and 4510 and a light-emitting element 4511 that are formed over a first substrate 4501 are sealed by a second substrate 4506 and a sealant 4505. Here, FIG. 13A is a plan view and FIG. 13B is a cross-sectional view taken along line H-I in FIG. 13A.

The sealant 4505 is provided to surround a pixel portion 4502, signal line driver circuits 4503a and 4503b, and scan line driver circuits 4504a and 4504b, which are provided over the first substrate 4501. In addition, the second substrate 4506 is provided over the pixel portion 4502, the signal line driver circuits 4503a and 4503b, and the scan line driver circuits 4504a and 4504b. In other words, the pixel portion 4502, the signal line driver circuits 4503a and 4503b, and the scan line driver circuits 4504a and 4504b are sealed together with a filler 4507, with the first substrate 4501, the sealant 4505, and the second substrate 4506. Packaging (sealing) is preferably performed, in such a manner, using a protective film (e.g., a bonding film or an ultraviolet curable resin film), a cover material, or the like with high air-tightness and little degasification.

The pixel portion 4502, the signal line driver circuits 4503a and 4503b, and the scan line driver circuits 4504a and 4504b, which are formed over the first substrate 4501, each include a plurality of thin film transistors. FIG. 13B illustrates the thin film transistor 4510 included in the pixel portion 4502 and the thin film transistor 4509 included in the signal line driver circuit 4503a.

As the thin film transistors 4509 and 4510, any of the thin film transistors described in the above embodiments can be employed.

A first electrode 4517 that is a pixel electrode of the light-emitting element 4511 is electrically connected to a source electrode or a drain electrode of the thin film transistor 4510. Note that the structure of the light-emitting element 4511 is not limited to the stacked structure in this embodiment, which includes the first electrode 4517, a light-emitting layer 4513, and a second electrode 4514. The structure of the light-emitting element 4511 can be changed as appropriate depending on the direction in which light is extracted from the light-emitting element 4511, or the like.

As for the first electrode 4517 and the second electrode 4514, an electrode that functions as a cathode can be formed using a conductive film that has a small work function and reflects light. For example, the electrode that functions as a cathode is preferably formed using a material such as Ca, Al, MgAg, or AlLi. An electrode that functions as an anode is formed using a light-transmitting conductive material. For example, a light-transmitting conductive material such as indium oxide containing tungsten oxide, indium zinc oxide containing tungsten oxide, indium oxide containing titanium oxide, indium tin oxide containing titanium oxide, indium tin oxide, indium zinc oxide, or indium tin oxide to which silicon oxide is added may be used.

A partition 4520 is formed using an organic resin film, an inorganic insulating film, organic polysiloxane, or the like. It is particularly preferable that the partition 4520 be formed using a photosensitive material to have an opening over the first electrode 4517 so that a sidewall of the opening is formed as an inclined surface with continuous curvature.

The light-emitting layer 4513 may be formed using a single layer or a plurality of layers stacked.

A protective film may be formed over the second electrode 4514 and the partition 4520 in order to prevent oxygen, hydrogen, water, carbon dioxide, or the like from entering the light-emitting element 4511. As the protective film, a silicon nitride film, a silicon nitride oxide film, a DLC film, or the like can be formed.

A variety of signals are supplied from FPCs 4518a and 4518b to the signal line driver circuits 4503a and 4503b, the scan line driver circuits 4504a and 4504b, the pixel portion 4502, or the like.

In this embodiment, an example is described in which a connection terminal electrode 4515 is formed using the same conductive film as the first electrode 4517 of the light-emitting element 4511, and a terminal electrode 4516 is formed using the same conductive film as the source or drain electrode of the thin film transistors 4509 and 4510.

The connection terminal electrode 4515 is electrically connected to a terminal included in the FPC 4518a via an anisotropic conductive film 4519.

The substrate located in the direction in which light is extracted from the light-emitting element 4511 needs to have a light-transmitting property. As a substrate having a light-transmitting property, a glass plate, a plastic plate, a polyester film, an acrylic film, and the like are given.

As the filler 4507, an ultraviolet curable resin, a thermosetting resin, or the like can be used, in addition to an inert gas such as nitrogen or argon. For example, polyvinyl chloride (PVC), acrylic, polyimide, an epoxy resin, a silicone resin, polyvinyl butyral (PVB), ethylene vinyl acetate (EVA), or the like can be used. In this embodiment, an example in which nitrogen is used for the filler is described.

If needed, an optical film, such as a polarizing plate, a circularly polarizing plate (including an elliptically polarizing plate), a retardation plate (a quarter-wave plate or a half-wave plate), or a color filter, may be provided on a light-emitting surface of the light-emitting element. Furthermore, an antireflection treatment may be performed on a surface thereof. For example, anti-glare treatment by which reflected light can be diffused by projections and depressions on the surface so as to reduce the glare can be performed.

The signal line driver circuits 4503a and 4503b and the scan line driver circuits 4504a and 4504b may be formed using a single crystal semiconductor or a polycrystalline semiconductor over a substrate separately prepared. Alternatively, only the signal line driver circuits or part thereof or only the scan line driver circuits or part thereof may be separately formed and mounted. This embodiment is not limited to the structure illustrated in FIGS. 13A and 13B.

Through the above-described steps, a high-definition light-emitting display device (display panel) can be manufactured. This embodiment can be implemented in appropriate combination with the structures described in the other embodiments.

(Embodiment 10)

In this embodiment, examples of electronic devices each including the display device described in the above embodiment will be described.

Figure 14A:
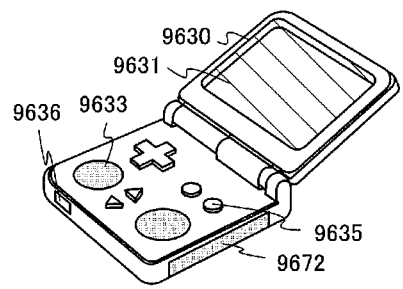
FIGS. 14A to 14C are views each illustrating an electronic device.

FIG. 14A illustrates a portable game machine, which includes a housing 9630, a display portion 9631, a speaker 9633, operation keys 9635, a connection terminal 9636, a memory medium insert portion 9672, and the like. The portable game machine illustrated in FIG. 14A has a function of reading a program or data stored in the recording medium to display it on the display portion, a function of sharing information with another portable game machine by wireless communication, and the like. Note that the portable game machine illustrated in FIG. 14A can have a variety of functions without limitation to the above-described functions.

Figure 14B:
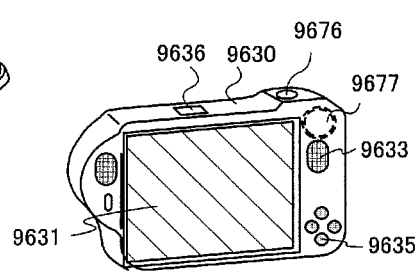

FIG. 14B illustrates a digital camera, which includes the housing 9630, the display portion 9631, the speaker 9633, the operation keys 9635, the connection terminal 9636, a shutter button 9676, an image receiving portion 9677, and the like. The digital camera with a television reception function illustrated in FIG. 14B has a function of photographing a still image and/or a moving image, a function of automatically or manually correcting the photographed image, a function of obtaining various kinds of information from an antenna, a function of storing the photographed image or the information obtained from the antenna, a function of displaying the photographed image or the information obtained from the antenna on the display portion, and the like. Note that the digital camera with the television reception function illustrated in FIG. 14B can have a variety of functions without limitation to the above-described functions.

Figure 14C:
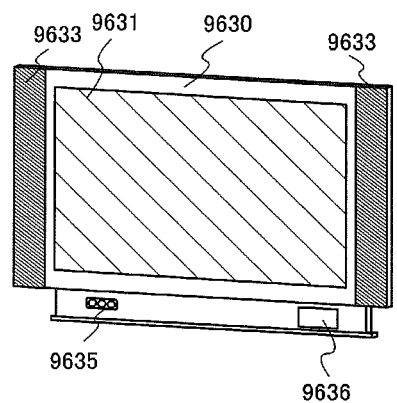

FIG. 14C illustrates a television set, which includes the housing 9630, the display portion 9631, the speakers 9633, the operation keys 9635, the connection terminal 9636, and the like. The television set illustrated in FIG. 14C has a function of converting an electric wave for television into an image signal, a function of converting the image signal into a signal suitable for display, a function of converting a frame frequency of the image signal, and the like. Note that the television set illustrated in FIG. 14C can have a variety of functions without limitation to the above-described functions.

Figure 15A:
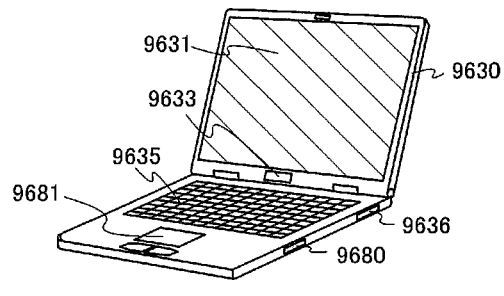
FIGS. 15A to 15C are views each illustrating an electronic device.

FIG. 15A illustrates a computer, which includes the housing 9630, the display portion 9631, the speaker 9633, the operation keys 9635, the connection terminal 9636, a pointing device 9681, an external connection port 9680, and the like. The computer illustrated in FIG. 15A has a function of displaying a various kinds of information (e.g., a still image, a moving image, and a text image) on the display portion, a function of controlling processing by various kinds of software (programs), a communication function such as wireless communication or wired communication, a function of being connected to a variety of computer networks with the communication function, a function of transmitting or receiving a variety of data with the communication function, and the like. Note that the computer illustrated in FIG. 15A can have a variety of functions without limitation to the above-described functions.

Figure 15B:
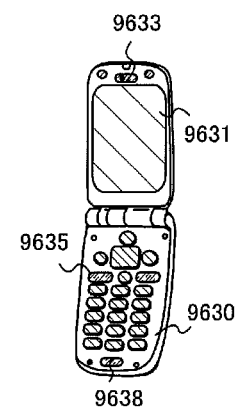

FIG. 15B illustrates a mobile phone, which includes the housing 9630, the display portion 9631, the speaker 9633, the operation keys 9635, a microphone 9638, and the like. The mobile phone illustrated in FIG. 15B has a function of displaying various kinds of information (e.g., a still image, a moving image, and a text image) on the display portion, a function of displaying a calendar, a date, the time, or the like on the display portion, a function of operating or editing the information displayed on the display portion, a function of controlling processing by various kinds of software (programs), and the like. Note that the mobile phone illustrated in FIG. 15B can have a variety of functions without limitation to the above-described functions.

Figure 15C:
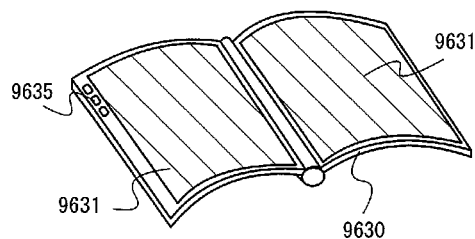

FIG. 15C illustrates a device including electronic paper (the device is also referred to as an e-book reader), which includes the housing 9630, the display portion 9631, the operation keys 9635, and the like. The e-book reader illustrated in FIG. 15C has a function of displaying various kinds of information (e.g., a still image, a moving image, and a text image) on the display portion, a function of displaying a calendar, a date, the time, or the like on the display portion, a function of operating or editing the information displayed on the display portion, a function of controlling processing by various kinds of software (programs), and the like. Note that the electronic paper illustrated in FIG. 15C can have a variety of functions without limitation to the above-described functions.

In each of the electronic devices described in this embodiment, off-state current can be reduced in a plurality of pixels included in the display portion. Thus, an electronic device that includes a display device which consumes less power can be obtained. Further, when aperture ratio is increased, the display device can include a high-definition display portion.

This embodiment can be implemented in appropriate combination with the structures described in the other embodiments.

This application is based on Japanese Patent Application serial no. 2009-251065 filed with Japan Patent Office on Oct. 30, 2009, the entire contents of which are hereby incorporated by reference.

The invention claimed is:

1. A transistor comprising:
a first electrode over a substrate, wherein end portions of the first electrode have a tapered shape;
an oxide semiconductor film on and in contact with the first electrode, wherein end portions of the oxide semiconductor film have a tapered shape;
a second electrode on and in contact with the oxide semiconductor film, wherein end portions of the second electrode have a tapered shape;
a gate insulating film on at least side surfaces of the oxide semiconductor film; and
a third electrode having a ring shape, the third electrode adjacent to the side surfaces of the oxide semiconductor film with the gate insulating film interposed therebetween.

2. The transistor according to claim 1,
wherein the first electrode functions as one of a source electrode and a drain electrode,
wherein the second electrode functions as the other of the source electrode and the drain electrode, and
wherein the third electrode functions as a gate electrode.

3. The transistor according to claim 1, wherein carrier concentration of the oxide semiconductor film is lower than or equal to $5 \times 10^{14}/cm^3$.

4. The transistor according to claim 1, wherein hydrogen concentration of the oxide semiconductor film is lower than or equal to $5 \times 10^{19}/cm^3$.

5. A display device comprising the transistor according to claim 1, wherein the display device is incorporated into one selected from the group consisting of a portable game machine, a digital camera, a television set, a computer, a mobile phone and a device including electronic paper.

6. A transistor comprising:
a first electrode over a substrate;
an oxide semiconductor film on and in contact with the first electrode;
a second electrode on and in contact with the oxide semiconductor film;
a gate insulating film on at least side surfaces of the oxide semiconductor film;
a third electrode having a ring shape, the third electrode adjacent to the side surfaces of the oxide semiconductor film with the gate insulating film interposed therebetween;
an interlayer insulating film over the third electrode,
an opening in the gate insulating film and the interlayer insulating film, and
a wiring electrically connected to the second electrode via the opening.

7. The transistor according to claim 6,
wherein the first electrode functions as one of a source electrode and a drain electrode,
wherein the second electrode functions as the other of the source electrode and the drain electrode, and
wherein the third electrode functions as a gate electrode.

8. The transistor according to claim 6, wherein carrier concentration of the oxide semiconductor film is lower than or equal to $5 \times 10^{14}/cm^3$.

9. The transistor according to claim 6, wherein hydrogen concentration of the oxide semiconductor film is lower than or equal to $5 \times 10^{19}/cm^3$.

10. The transistor according to claim 6, wherein the interlayer insulating film comprises a material selected from the group consisting of a silicon oxide film, a silicon oxynitride film, an aluminum oxide film, an aluminum oxynitride film, a silicon nitride film, a silicon nitride oxide film, an aluminum nitride film and an aluminum nitride oxide film.

11. An display device comprising the transistor according to claim 6, wherein the display device is incorporated into one selected from the group consisting of a portable game machine, a digital camera, a television set, a computer, a mobile phone and a device including electronic paper.

12. A transistor comprising:

a first electrode over a substrate, wherein end portions of the first electrode have a tapered shape;

an island-shaped oxide semiconductor film on and in contact with the first electrode, wherein the island-shaped oxide semiconductor film includes a crystal grain, and end portions of the island-shaped oxide semiconductor film have a tapered shape;

a second electrode on and in contact with the island-shaped oxide semiconductor film, wherein end portions of the second electrode have a tapered shape;

a gate insulating film on at least side surfaces of the island-shaped oxide semiconductor film; and a third electrode covering the side surfaces of the island-shaped oxide semiconductor film with the gate insulating film interposed therebetween.

13. The transistor according to claim 12,
wherein the first electrode functions as one of a source electrode and a drain electrode,
wherein the second electrode functions as the other of the source electrode and the drain electrode, and
wherein the third electrode functions as a gate electrode.

14. The transistor according to claim 12, wherein carrier concentration of the island-shaped oxide semiconductor film is lower than or equal to $5 \times 10^{14}/cm^3$.

15. The transistor according to claim 12, wherein hydrogen concentration of the island-shaped oxide semiconductor film is lower than or equal to $5 \times 10^{19}/cm^3$.

16. A display device comprising the transistor according to claim 12, wherein the display device is incorporated into one selected from the group consisting of a portable game machine, a digital camera, a television set, a computer, a mobile phone and a device including electronic paper.

* * * * *